(12) United States Patent
Rohrmann et al.

(10) Patent No.: US 11,476,099 B2
(45) Date of Patent: Oct. 18, 2022

(54) METHODS OF AND APPARATUS FOR MAGNETRON SPUTTERING

(71) Applicant: EVATEC AG, Trubbach (CH)

(72) Inventors: Hartmut Rohrmann, Schriesheim (DE); Claudiu Valentin Falub, Zurich (CH); Martin Bless, Malans SG (CH)

(73) Assignee: EVATEC AG, Trübbach (CH)

( * ) Notice: Subject to any disclaimer, the term of this patent is extended or adjusted under 35 U.S.C. 154(b) by 0 days.

(21) Appl. No.: 16/968,893

(22) PCT Filed: Apr. 16, 2018

(86) PCT No.: PCT/EP2018/059676
§ 371 (c)(1),
(2) Date: Aug. 11, 2020

(87) PCT Pub. No.: WO2019/158225
PCT Pub. Date: Aug. 22, 2019

(65) Prior Publication Data
US 2021/0050193 A1    Feb. 18, 2021

(30) Foreign Application Priority Data
Feb. 13, 2018 (CH) .................... 00175/18

(51) Int. Cl.
*H01J 37/34* (2006.01)
*C23C 14/35* (2006.01)

(52) U.S. Cl.
CPC .......... *H01J 37/3408* (2013.01); *C23C 14/35* (2013.01); *H01J 37/3452* (2013.01)

(58) Field of Classification Search
CPC ... C23C 14/35; H01J 37/3266; H01J 37/3408; H01J 37/345; H01J 37/3452
USPC ......................................... 204/298.16, 192.2
See application file for complete search history.

(56) References Cited

U.S. PATENT DOCUMENTS

| 4,853,102 A * | 8/1989 | Tateishi ............ H01J 37/32706 |
| | | 204/298.06 |
| 6,361,667 B1 * | 3/2002 | Kobayashi ............ C23C 14/351 |
| | | 204/298.11 |
| 2005/0034981 A1 | 2/2005 | Fuchs et al. |
| 2005/0205412 A1 | 9/2005 | Rohrmann et al. |
| 2007/0205096 A1 | 9/2007 | Nagashima |
| 2009/0159429 A1 | 6/2009 | Tsukamoto |

(Continued)

FOREIGN PATENT DOCUMENTS

| EP | 1193729 A2 | 4/2002 |
| GB | 2078787 A | 1/1982 |

(Continued)

OTHER PUBLICATIONS

Machine Translation JP 2000-017435 (Year: 1998).*

(Continued)

*Primary Examiner* — Rodney G McDonald
(74) *Attorney, Agent, or Firm* — Pearne & Gordon LLP

(57) ABSTRACT

In a magnetron sputtering reaction space a magnetron magnetic field is generated. A further magnetic field is generated in the reaction space whereby a resultant magnetic field has a directional component parallel to a target plane which is larger than the directional component of the magnetron magnetic field parallel to the target plane in the reaction space.

26 Claims, 17 Drawing Sheets

(56) References Cited

U.S. PATENT DOCUMENTS

Figure 1:
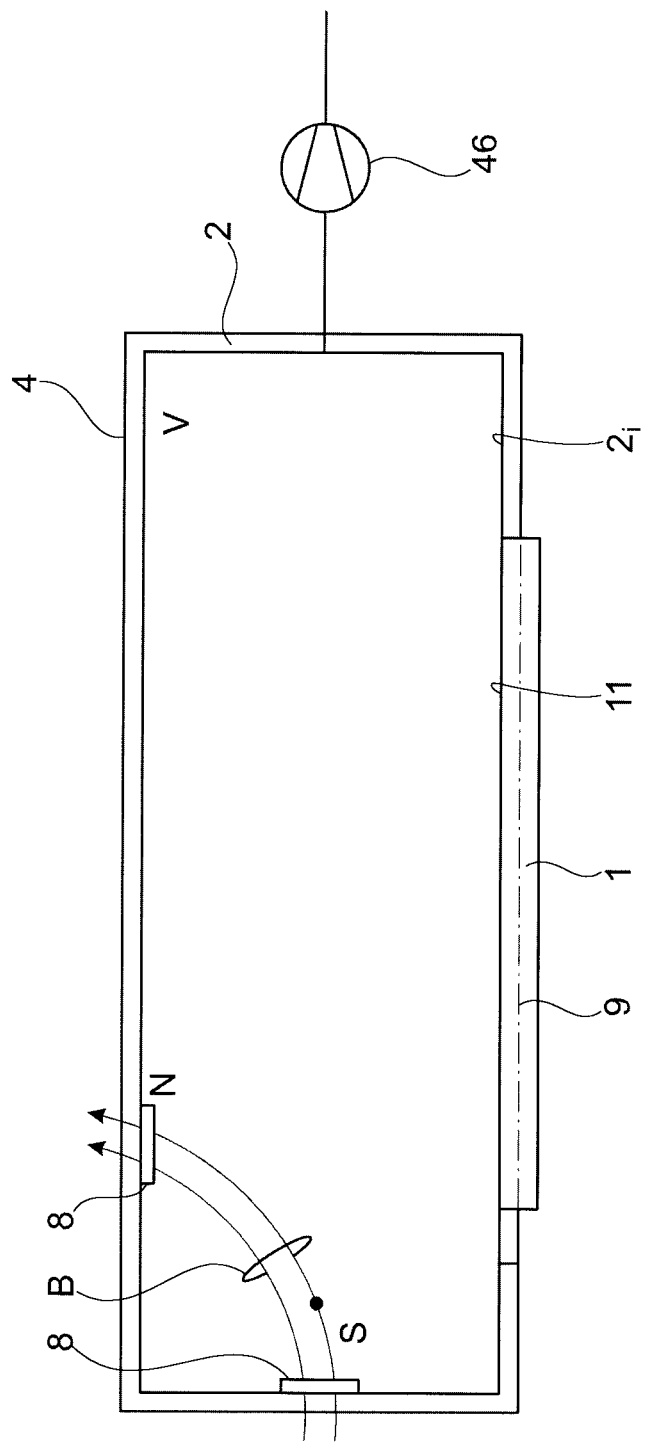

2014/0076716 A1 3/2014 Gorokhovsky et al.
2018/0355474 A1 12/2018 Kobayashi et al.

FOREIGN PATENT DOCUMENTS

| GB | 2096177 | A | | 10/1982 |
|---|---|---|---|---|
| JP | 62-054907 | | * | 3/1987 |
| JP | 63-957765 | | * | 3/1988 |
| JP | 03-111561 | | * | 5/1991 |
| JP | 05-339727 | | * | 12/1993 |
| JP | 2000-017435 | | * | 7/1998 |
| WO | 2008080244 | A1 | | 7/2008 |
| WO | 2017169448 | A1 | | 10/2017 |

OTHER PUBLICATIONS

Machine Translation 05-339727 (Year: 1993).*
Machine Translation 62-054907 (Year: 1987).*
Machine Translation 03-111561 (Year: 1991).*
Machine Translation 63-057765 (Year: 1988).*

International Search Report for PCT/EP2018/059676 dated Oct. 11, 2018.
Written Opinion for PCT/EP2018/059676 dated Oct. 11, 2018.
Falub, Claudiu V., "Innovating the Soft Magnetics for Tomorrow's RF Passive Devices", Layers, Edition 3, Extract from Layers 2017-18, Nov. 14, 2017, EVATEC Process Systems.
Falub, Claudiu V., et al., "Structural and Ferromagnetic Properties of Sputtered FeCoB/AlN Soft Magnetic Multilayers for GHz Applications", IEEE Transaction on Magnetics, Nov. 2017, May 10, 2017, vol. 53, No. 11.
Falub, Claudiu V., et al., "Innovative soft magnetic multilayers with enhanced in-plane anisotropy and ferromagnetic resonance frequency for integrated RF passive devices", AIP Advances 8, 048002 (2018), Oct. 23, 2017, pp. 1-14, American Institute of Physics.
Hida, Rachid, et al., "Nanolaminated FeCoB/FeCo and FeCoB/NiFe soft magnetic thin films with tailored magnetic properties deposited by magnetron sputtering", Journal of Magnetism and Magnetic Materials 453, (2018) Jan. 23, 2018, pp. 211-219, Elsevier B.V.
Falub, Claudiu V., et al., "Tailoring the soft magnetic properties of sputtered multilayers by microstructure engineering for high frequency applications", AIP Advances 7, 056414 (2017), Jan. 9, 2017, pp. 1-7, American Institute of Physics.

* cited by examiner

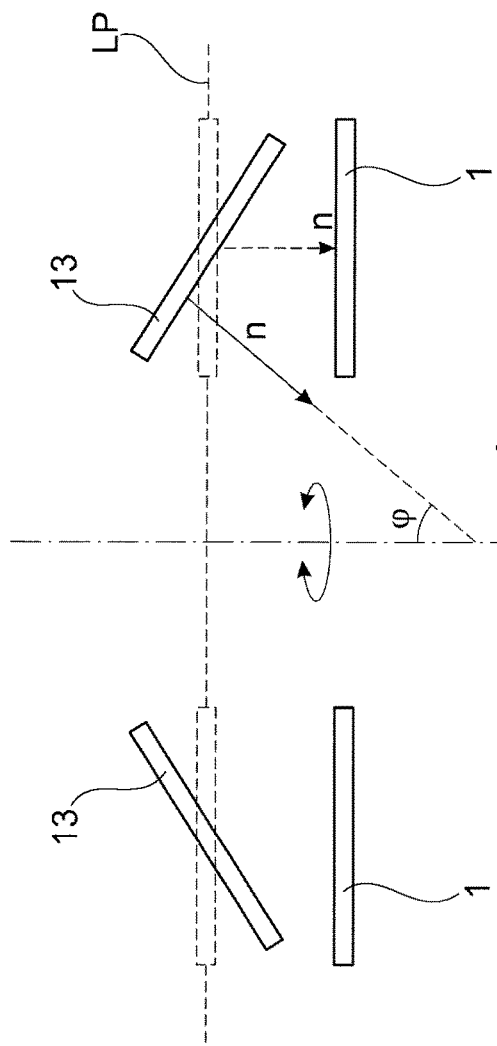
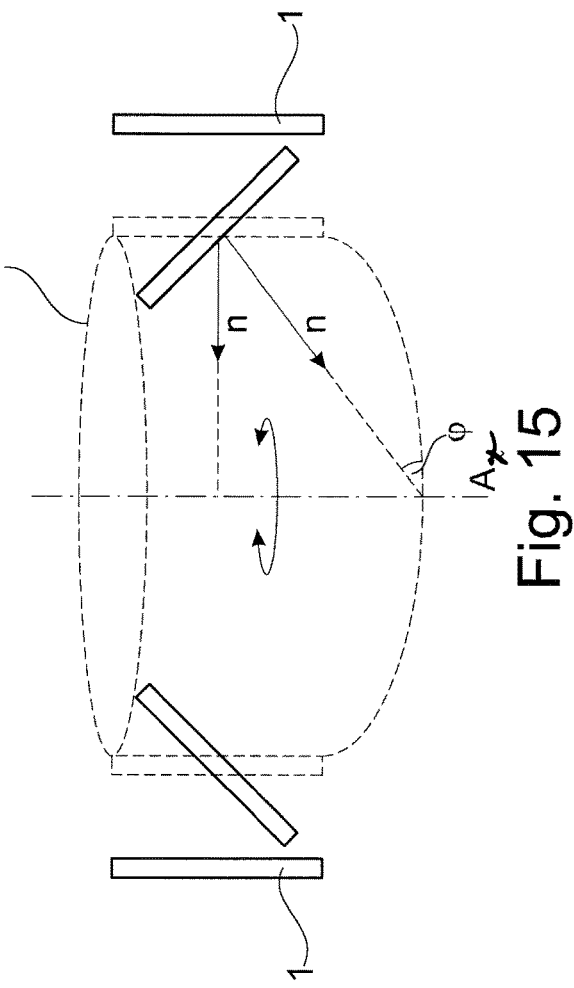
Fig. 14
Fig. 15

METHODS OF AND APPARATUS FOR MAGNETRON SPUTTERING

The present invention is directed to magnetron sputtering and, in some variants and embodiments thereof, to simultaneously controlling the direction of magnetic anisotropy in a ferromagnetic layer to be unidirectional.

Although perfectly known to the artisan skilled in magnetic properties of materials, we refer with respect to "magnetic anisotropy", to William D. Callister, Jr., Department of Metallurgical Engineering, The University of Utah, "Material Science and Engineering, an Introduction", Seventh Edition, John Wiley & Sons, Inc. especially chapter 20.8 "Magnetic Anisotropy".

Thus, when we speak of controlling the magnetic anisotropy of a sputter-deposited layer of ferromagnetic material to be unidirectional, we address that throughout the ferromagnetic material of at least a predominant area of such layer, the "easy magnetization" and thus also the "hard crystallographic direction", perpendicular to the "easy-magnetization"-direction, become unidirectional and become defined with respect to one directional axis along the addressed area of the layer.

As further perfectly known to the artisan skilled in the magnetron sputtering art, in magnetron sputtering, the magnetron magnetic field looping along the sputter surface of a target establishes a loop of increased plasma density due to the so-called electron trapping effect. This effect is caused by the components of the magnetron magnetic field parallel to the sputter surface and the electric field perpendicular to the sputter surface. The erosion profile on the target becomes a loop according to the loop of the magnetron magnetic field. The resultant localized erosion profile leads to a poor exploitation of the target and to an angular spacial distribution of sputtered-off target material which varies in time e.g. due to the increasing depth of the erosion profile. So as to improve exploitation of the target by more homogeneous abrasion along the sputter surface of the target, it is known to move the loop of the magnetron magnetic field along the sputter surface. This necessitates a magnet dipole arrangement moving relative to the target and beneath the target.

It is an object of the present invention to provide alternative magnetron sputtering methods and apparatus.

This is achieved by a method of magnetron sputter-deposition or of manufacturing a substrate coated with a magnetron-sputter-deposited layer, comprising:
providing in a vacuum enclosure a target having a sputter surface and extending along a target plane;
providing a substrate having a surface to be sputter coated;
providing a reaction space between the sputter surface and the surface to be sputter coated;
generating in the reaction space a magnetron magnetic field, the magnetic field lines thereof arcing between a first outer pole surface of the sputter surface and a first inner pole surface, the first outer pole surface forming a closed loop on the sputter surface around the first inner pole surface, seen in a direction towards the sputter surface;
generating in the reaction space and between at least one second outer pole surface and at least one second inner pole surface a further magnetic field;
generating in the reaction space, by superposition of the magnetron magnetic field and the further magnetic field, a resultant magnetic field, the directional component of the resultant magnetic field parallel to the target plane at a locus in the reaction space being larger than the directional component of the magnetron magnetic field parallel to the target plane at this locus, at least in a predominant volume-area of the reaction space.

Definitions

1) We understand throughout the present description and claims and as explained with the help of FIG. 1 under a "pole surface",—in context with a sputtering apparatus or with a method of sputter coating a substrate or of manufacturing a sputter coated substrate—the following:

A void volume V of a vacuum enclosure 4 is enclosed by the inner surface $2_i$ of the walls 2 of the enclosure 4 and by the sputter-surface 11 to be sputtered-off of one or more than one targets 1. The walls 2 of the vacuum enclosure 4 may have openings as for pumping purpose, feed throughs etc. and is thus per se not necessarily vacuum tight. A surface area 8 of the surfaces $2_i$ and 11 along which the predominant part of a magnetic field B transits from solid material to the gaseous atmosphere of the volume V or inversely is called a "pole surface". A pole surface 8 has one of the magnetic polarities N or S.

2) A magnetic field B is generated by a "magnetic dipole arrangement" (not shown in FIG. 1). Such magnetic dipole arrangement comprises one or more than one permanent- or electro-magnets, connected in parallel or in series, in sputtering art normally permanent magnets. The magnetic dipole arrangement may further comprise a structure of one or more than one magnetic yokes. In fact, a magnetic dipole arrangement completes a magnetic circuit including pole surfaces 8 of magnetic polarities N, S and a part of the void volume V.

3) We understand throughout the description and the claims under "predominant", more than 50%.

4) We understand throughout the description and the claims under "substrate orientation" the following: Establishing a x/y cartesian coordinate system in the substrate plane and a straight line on and across the substrate parallel to the x/y plane, the angular orientation of the substrate is the angle of such straight line to the x or to the y axis of the coordinate system. The straight line may or may not be physically marked on the substrate.

5) We understand throughout the description and claims under a "substrate plane" a plane which is defined by the substrate holder and along which a substrate held on the substrate holder extends. Thereby the substrate is not necessarily planar. The substrate may be planar or arched or curved forth and back along the substrate plane etc.

6) We understand throughout the description and claims under a "target plane" a plane which is most often defined by the target holder and along which a target mounted on the target holder extends. Thereby the sputter surface, in its yet uneroded state, is not necessarily planar, it may be planar or possibly arched or even curved forth and back etc.

In the case in which the target is realized by a drivingly rotatable, hollow cylinder, the magnetron magnet arrangement being e.g. stationary within the hollow cylinder and pointing towards the substrate, the target plane is understood as a sectional plane parallel to the rotational axis of the target cylinder and delimits that segment of the target cylinder momentarily exposed to the substrate from the remainder of the target cylinder.

By the further magnetic field, the erosion profile loop on the target is enlarged leading to an improved target material exploitation and to the angular distribution of sputtered-off target material varying less in time. This may be achieved without moving a magnetic dipole arrangement relative to the target.

Moreover, the superposition as addressed leads to an increased strength of the magnetic field in the reaction space over the magnetron magnetic field strength, resulting in an increased plasma density and thus in an increased sputter rate.

One variant of the methods according to the invention comprises generating the resultant magnetic field along a predominant surface area of the sputter surface.

One variant of the methods according to the invention comprises generating the resultant magnetic field along a predominant surface area of the surface of the substrate to be sputter coated.

With respect to a propagation axis of the loop of the magnetron magnetic field, the larger that the area of the sputter surface is which is exposed to components of the magnetron magnetic field parallel to the sputter surface and perpendicular to the propagation axis of the loop of the magnetron magnetic field, the larger becomes the effect of the further magnetic field in widening the erosion profile in the target, also called race track.

This is achieved by a variant of the method according to the invention in which tailoring of the magnetron magnetic field and of the further magnetic field in the reaction space is performed so, that, seen in the direction towards the sputter surface, i.e. in top view on the target, field lines of the further magnetic field are parallel to field lines of the magnetron magnetic field along at least a part of the closed loop.

According to one variant of the methods according to the invention the at least one second outer pole surface is provided outside the first outer pole surface, seen in the direction towards the sputter surface, i.e. in top view on the target.

One variant of the methods according to the invention comprises selecting magnetic polarity of the first outer pole surface and of the at least one second outer pole surfaces to be equal and selecting the magnetic polarity of the first inner pole surface and of the at least one second inner pole surfaces to be equal.

In one variant of the methods according to the invention the at least one second inner pole surface is provided as a part of the sputter surface.

In one variant of the methods according to the invention the at least one second inner pole surface is provided distant from and opposite said sputter surface.

In one variant of the methods according to the invention the at least one second inner pole surface is provided opposite the sputter surface with respect to the substrate e.g. behind the substrate.

In one variant of the methods according to the invention providing the at least one second outer pole surface, seen parallel to the target plane, i.e. in a lateral view, is performed in at least one of the following positions:
  opposite the sputter surface with respect to the substrate;
  aligned with the substrate;
  between the target plane and the substrate and closer to the substrate than to the target plane;
  between the target plane and the substrate and more distant from the substrate than from the target plane;
  between the target plane and the substrate and equidistant from the substrate and from the target plane;
  aligned with the target plane;
  opposite the substrate with respect to the target plane.

Please note that if a substrate is not plane and thus a distance to such substrate may possibly not be clearly defined, instead such distance is defined with respect to a substrate plane, along which such substrate is held by a respective substrate holder.

In one variant of the methods according to the invention the material of the target is selected to be a ferromagnetic material and the direction of magnetic anisotropy in the layer sputter-deposited on the substrate and along at least a predominant part of that surface of the substrate to be sputter coated, is controlled by the resultant magnetic field to be or to become unidirectional.

One variant of the methods according to the invention, in which the target is selected of a ferromagnetic material as addressed, comprises generating the resultant magnetic field along a predominant surface area of the surface of the substrate to be sputter coated.

In one variant such resultant field is homogeneous along the addressed surface area.

One variant of the methods according to the invention, in which the target is selected of a ferromagnetic material as addressed, comprises tailoring the magnetron magnetic field and the further magnetic field in the reaction space so, that, seen in the direction towards the sputter surface, i.e. in a top view towards the target, field lines of the further magnetic field are parallel to field lines of the magnetron magnetic field, along at least a part of the closed loop.

In one variant of the methods according to the invention, in which the target is selected of a ferromagnetic material as addressed, the at least one second outer pole surface is provided outside the first outer pole surface, seen in a direction towards the sputter surface, i.e. in a top view towards the target.

In one variant of the methods according to the invention, in which the target is selected of a ferromagnetic material as addressed, the magnetic polarity of the first outer pole surface and of the at least one second outer pole surface are selected to be equal and the magnetic polarity of the first inner pole surface and of the at least one second inner pole surface are selected to be equal.

In one variant of the methods according to the invention, in which the target is selected of a ferromagnetic material as addressed, the at least one second inner pole surface is provided opposite the sputter surface with respect to the substrate e.g. behind the substrate.

In one variant of the methods according to the invention, in which the target is selected of a ferromagnetic material as addressed, the least one second outer pole surface, seen parallel to said target plane, is provided in at least one of the following positions:
  opposite to the sputter surface with respect to the substrate;
  aligned with the substrate;
  between the target plane and the substrate and closer to the substrate than to the target plane;
  between the target plane and the substrate and more distant from the substrate than from the target plane;
  between the target plane and the substrate and equidistant from the substrate and from the target plane;
  Aligned with the target plane;
  opposite the substrate with respect to the target plane.

In one variant of the methods according to the invention, in which the target is selected of a ferromagnetic material as addressed, the at least one second outer pole surface, seen parallel to said target plane, i.e. in a lateral view, is provided opposite the sputter surface with respect to the substrate.

One variant of the methods according to the invention comprises providing the loop with a maximum loop diameter, the at least one second outer pole surface comprising an arrangement of limited extent of at least one second pole surface on one side of the maximum diameter and a further arrangement of limited extent of at least one second pole surface on the other side of the maximum diameter, seen in a direction towards the sputter surface, i.e. in a top view towards the target.

One variant of the variant as just addressed of the methods according to the invention comprises, seen in a direction towards the sputter surface, providing a first leg of the first outer pole surface extending on one side of the maximum diameter along a first linear—i.e. straight—locus and providing a second leg of the first outer pole surface extending on the other side of the maximum diameter along a second linear—i.e. straight—locus, the one arrangement extending along the first leg and the further arrangement extending along the second leg.

Please note that a part or surface "extending along a linear or straight locus" may be straight per se or may e.g. meander about such locus or be arching about such locus.

In one variant of the variant as just addressed of the methods according to the invention the first and second legs extend linearly i.e. are straight legs.

In one variant of the variant as just addressed of the methods according to the invention the first and second legs are selected to be parallel to each other.

In one variant of the methods according to the invention, the one arrangement and the further arrangement extend along respective linear—i.e. straight—loci seen in a direction towards the sputter surface i.e. in a top view towards the target.

In one variant of the just addressed variant of the methods according to the invention, the one and the further arrangements are selected to extend linearly i.e. are straight.

In one variant of the methods according to the invention the one and the further arrangements extend with respective constant spacing aside the respective legs.

One variant of the methods according to the invention comprises selecting a part of the vacuum-exposed surface of the vacuum enclosure as the at least one second outer pole surface or selecting the vacuum-exposed surface of a part mounted to the vacuum enclosure.

One variant of the method according to the invention comprises relatively moving the substrate and the target so that the substrate passes across the target.

One variant of the just addressed variant of the methods according to the invention comprises providing more than one of the substrates and performing the method according to the invention or according to at least one of the variants thereof subsequently on said more than one substrates.

One variant of the methods according to the invention comprises performing the methods according the invention or according to at least one of the variants thereof subsequently more than once upon a substrate.

One variant of the method according the invention comprises establishing the magnetron magnetic field and the further magnetic field so, that, seen towards the sputter surface i.e. in a top view towards the target, field-lines of the resulting magnetic field extend parallel to a directional axis, over a predominant part of the sputter surface and moving the substrate relative to the target at a constant angle of substrate orientation with respect to the directional axis.

In one variant of the methods according to the invention the substrate is rotated relative to the target around a rotation axis which is remote from the substrate.

In one variant of the method according to the invention, the rotation axis is intersecting the normal on the target plane with an angle between 45° and 0°, both limits included. In the variant in which the rotational axis "intersects" the addressed normal at an angle of 0°, the rotational axis is in fact parallel to the addressed normal, i.e. perpendicular to the target plane.

In one variant of the method according to the invention, the rotation axis is intersecting the normal on the target plane with an angle between 45° and 90°, both limits included. In the variant in which the rotational axis "intersects" the addressed normal at an angle of 90°, the rotational axis is in fact perpendicular to the addressed normal, i.e. parallel to the target plane.

In one variant of the methods according to the invention the rotation axis intersects normals on the surfaces to be sputter-coated of the substrates at angles between 0° and 45°, both limits included and in one variant at an angle of 0°. In this case the rotational axis is parallel to the normals on the surfaces to be sputter-coated of the substrates or to normals on respective substrate-planes defined by respective substrate holders.

In one variant of the methods according to the invention the rotation axis intersects normals on the surfaces to be sputter-coated of the substrates at angles between 45° and 90°, both limits included and in one variant at an angle of 90°. In this case the rotational axis is perpendicular to the normals on the surfaces to be sputter-coated of the substrates or to the normals on the respective substrate-planes defined by respective substrate holders.

One variant of the methods according to the invention comprises generating, nearer to the surface to be sputter coated, the strength of the further magnetic field to be larger than the strength of the magnetron magnetic field, and, more remote from the surface to be sputter coated, the strength of the further magnetic field to be weaker than the strength of the magnetron magnetic field.

It is perfectly clear to the artisan skilled in magnetron sputtering, that the first outer pole surface and commonly also the at least one first inner pole surface are respective parts of the sputtering surface.

In one variant of the methods according to the invention the first and the second outer pole surfaces as well as the first and the second inner pole surfaces are at least relative to each other stationary. If they are not absolutely stationary, then they are moved together as one entity.

In one variant of the method according to the invention, the target plane and the substrate plane are parallel planes.

The addressed method-invention or every single variant of the method-invention as addressed may be combined with one or more than one of the variants or of the other variants as addressed, unless being in contradiction.

The addressed object of the present invention is further resolved by a sputtering apparatus comprising:
  a vacuum enclosure and therein:
  a substrate holder defining a substrate plane and tailored to hold a two-dimensionally extended substrate having a surface to be sputter coated;
  a target mounted to a target holder and extending along a target plane and having a sputter surface and a back surface;
  a magnetron magnet-dipole arrangement comprising, seen in a direction towards the sputter surface, i.e. in a top view towards the target, a first outer pole surface and a first inner pole surface, the first outer pole surface forming a closed loop around the first inner pole surface and along the sputter surface, the first outer pole surface being of one magnetic polarity, the first inner pole surface being of the other magnetic polarity;

a further magnet-dipole arrangement having at least one second outer pole surface and at least one second inner pole surface, and wherein, seen in direction towards the sputter surface, i.e. in a top view towards the target, the at least one second inner pole surface is within the loop of the first outer pole surface and the at least one second outer pole surface is distant from the second inner pole surface, the second outer pole surface having the one magnetic polarity as addressed, the second inner pole surface having the other magnetic polarity as addressed.

In one embodiment of the apparatus according to the invention the at least one second outer pole surface is located outside the first outer pole surface, seen in direction towards the sputter surface i.e. in a top view towards the target.

In one embodiment of the apparatus according to the invention the second outer pole surface is located outside the periphery of a substrate on the substrate holder, seen in the direction towards the sputter surface.

In one embodiment of the apparatus according to the invention the second outer pole surface is located outside the periphery of the target, seen in direction towards the sputter surface.

In one embodiment of the apparatus according to the invention the magnetron magnet-dipole arrangement and the further magnet-dipole arrangement is tailored so that field lines of a magnetron magnetic field generated by the magnetron magnet-dipole arrangement and field lines of a further magnetic field generated by the further magnet-dipole arrangement are mutually parallel along at least a part of the closed loop and as seen in the direction towards the sputter surface.

In one embodiment of the apparatus according to the embodiment of the invention just addressed, the target is of a ferromagnetic material.

In one embodiment of the apparatus according to the invention the first outer pole surface is a part of the sputter surface.

In one embodiment of the apparatus according to the invention the at least one second inner pole surface is a part of the sputter surface.

In one embodiment of the apparatus according to the invention the at least one second inner pole surface is distant from the sputter surface.

In one embodiment of the apparatus according to the invention the at least one second inner pole surface is located opposite the sputter surface with respect to the substrate plane e.g. behind the substrate.

In one embodiment of the apparatus according to the invention the at least one second outer pole surface, seen parallel to the target plane, i.e. in a lateral view, is in at least one of the following positions:
  opposite to the target plane with respect to the substrate plane;
  aligned with the substrate plane;
  between the target plane and the substrate plane and closer to the substrate plane than to the target plane;
  between the target plane and the substrate plane and more distant from the substrate plane than from the target plane;
  between the target plane and the substrate plane and equidistant from the substrate plane and from the target plane;
  aligned with the target plane;
  opposite the substrate plane with respect to the target plane.

In one embodiment of the apparatus according to the invention the first inner pole surface is a further closed loop, seen in the direction towards the sputter surface.

In one embodiment of the apparatus according to the just addressed embodiment of the invention the second inner pole surface is within said further closed loop, seen in the direction towards the sputter surface.

In one embodiment of the apparatus according to the invention at least parts of the first and of the second inner pole surfaces are overlapping, seen in the direction towards the sputter surface.

In one embodiment of the apparatus according to the invention the loop of the first outer pole surface has a maximum loop diameter, the at least one second outer pole surface comprises an arrangement of limited extent of at least one second pole surface on one side of the maximum diameter and a further arrangement of limited extent of at least one second pole surface on the other side of the maximum diameter, seen in the direction towards the sputter surface.

One embodiment of the apparatus according to the just addressed embodiment of the invention comprises, seen in the direction towards the sputter surface, a first leg of the first outer pole surface extending on one side of the maximum diameter along a first linear locus and a second leg of the first outer pole surface extending on the other side of the maximum diameter along a second linear locus, whereby the one arrangement extends along the first leg and the further arrangement extends along the second leg, still seen in the direction towards the sputter surface.

In one embodiment of the apparatus according to the just addressed embodiment of the invention the first and second legs are linear, i.e. straight, seen in the direction towards the sputter surface.

In one embodiment of the apparatus according to the just addressed embodiment of the invention the first and the second legs are parallel to each other, seen in a direction towards said sputter surface.

In one embodiment of the apparatus according to the invention the arrangement, as addressed above, and the further arrangement as addressed above, extend along respective linear loci, seen in the direction towards the sputter surface.

In one embodiment of the apparatus according to the just addressed embodiment of the invention the one and the further arrangements extend linearly, i.e. are straight, seen in the direction towards the sputter surface.

In one embodiment of the apparatus according to the invention the one and the further arrangements extend with respective constant spacing aside the respective legs, seen in a direction towards said sputter surface.

In one embodiment of the apparatus according to the invention a part of the vacuum-exposed surface of the vacuum enclosure is the at least one second outer pole surface or a vacuum exposed surface of a part mounted to the vacuum enclosure is the at least one second outer pole surface.

One embodiment of the apparatus according to the invention comprises at least one further vacuum treatment apparatus, the substrate holder on one hand and the target holder as well as the at least one further vacuum treatment apparatus on the other hand, are drivingly movable relatively to each other, passing the substrate holder across the sputter surface and passing the substrate holder to or from the at least one further vacuum treatment apparatus.

One embodiment of the apparatus according to the just addressed embodiment comprises more than one of the addressed substrate holders, movable, in one embodiment commonly movable, relative to the sputter surface and the at least one further vacuum treatment apparatus.

In one embodiment of the apparatus according to the invention at least one of the addressed further vacuum treatment apparatus is a sputtering chamber as was addressed and according to the invention or according to at least of the embodiments thereof.

In one embodiment of the apparatus according to the invention at least one of the sputtering apparatus as provided and seen in a direction towards the sputter surface thereof, the magnetron magnet-dipole arrangement and the further magnet-dipole arrangement are constructed so, that field lines of a resultant magnetic field, resulting from superposition of a magnetron magnetic field, generated by the magnetron magnet-dipole arrangement, and of a further magnetic field, generated by the further magnet-dipole arrangement, are parallel and extend in direction of a directional axis over a predominant part of the sputter surface or of the substrate holder, once aligned with the sputter surface, and the relative movement of the at least one substrate holder is controlled in such a manner, that the at least one substrate holder passes the sputter surface at a constant angular orientation with respect to the directional axis.

In one embodiment of the apparatus according to the invention the substrate holder is drivingly relatively rotatable around a rotation axis which is remote from the sputter surface.

In one embodiment of the apparatus according to the invention the rotation axis the rotation axis intersects normals on the substrate planes at angles between 0° and 45°, both limits included. In one embodiment the intersecting angle is 0° and thus the rotation axis is parallel to the addressed normals.

In one embodiment of the apparatus according to the invention the rotation axis intersects normals on the substrate planes at angles between 45° and 90°, both limits included. In one embodiment this angle is 90° and thus the rotation axis is perpendicular to the addressed normals.

In one embodiment of the apparatus according to the invention the rotation axis is intersecting the normal on the target plane with an angle between 45° and 0°, both limits included. In the variant in which the rotational axis "intersects" the addressed normal at an angle of 0°, the rotational axis is in fact parallel to the addressed normal, i.e. perpendicular to the target plane.

In one variant of the apparatus according to the invention, the rotation axis is intersecting the normal on the target plane with an angle between 45° and 90°, both limits included. In the variant in which the rotational axis "intersects" the addressed normal at an angle of 90°, the rotational axis is in fact perpendicular to the addressed normal, i.e. parallel to the target plane.

In one embodiment of the apparatus according to the invention the target is of a ferromagnetic material.

In one embodiment of the apparatus according to the invention the magnetron dipole arrangement and the further magnet-dipole arrangement are, at least relative to each other, stationary. If they are moveable, then they are moveable together as a unit.

In one embodiment of the apparatus according to the invention, the target plane and the substrate plane are parallel planes.

The addressed apparatus-invention or every single embodiment of the apparatus as addressed may be combined with one or more than one of the embodiments or of the other embodiments as addressed, unless being in contradiction.

Figure 2:
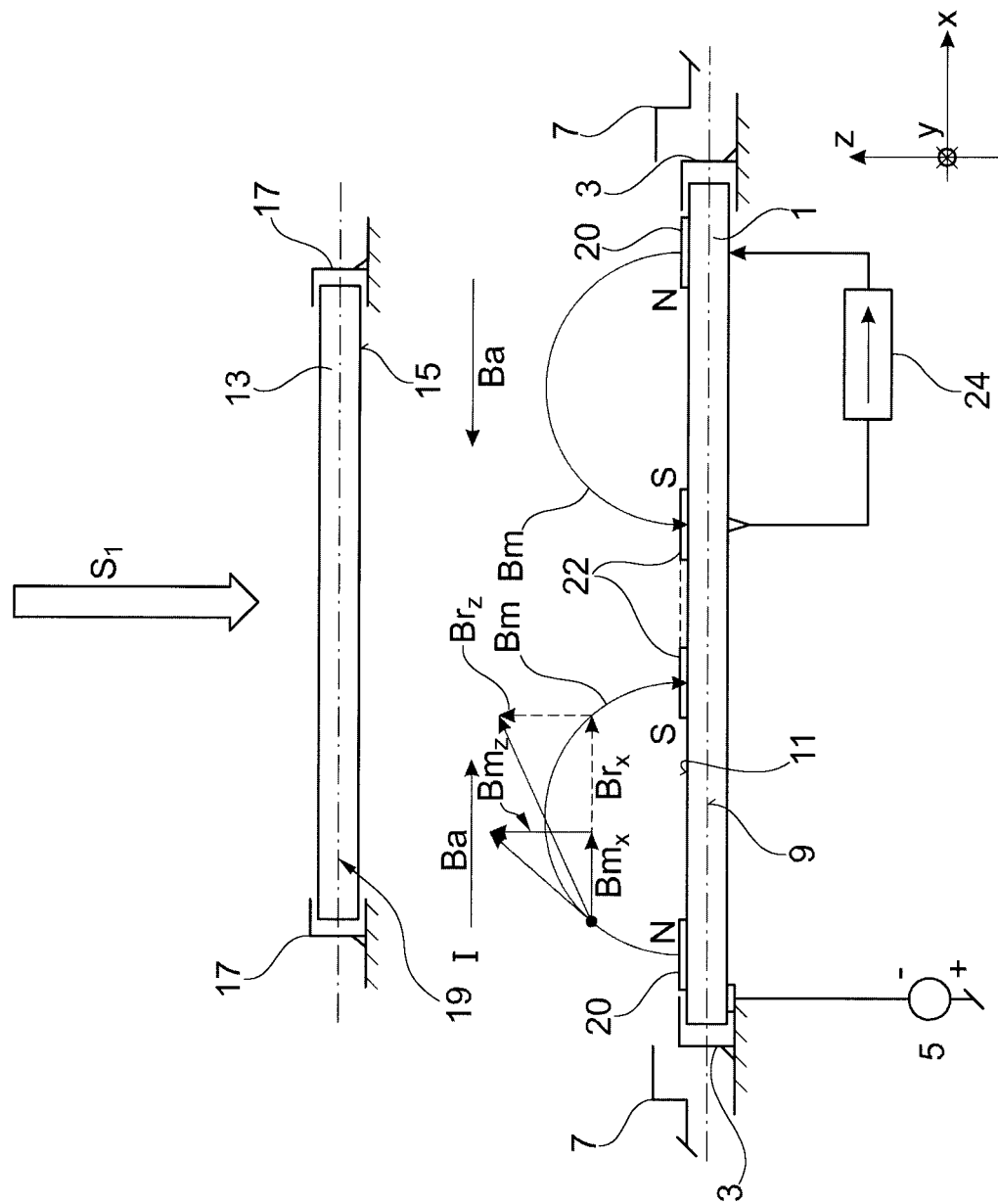
Figure 3:
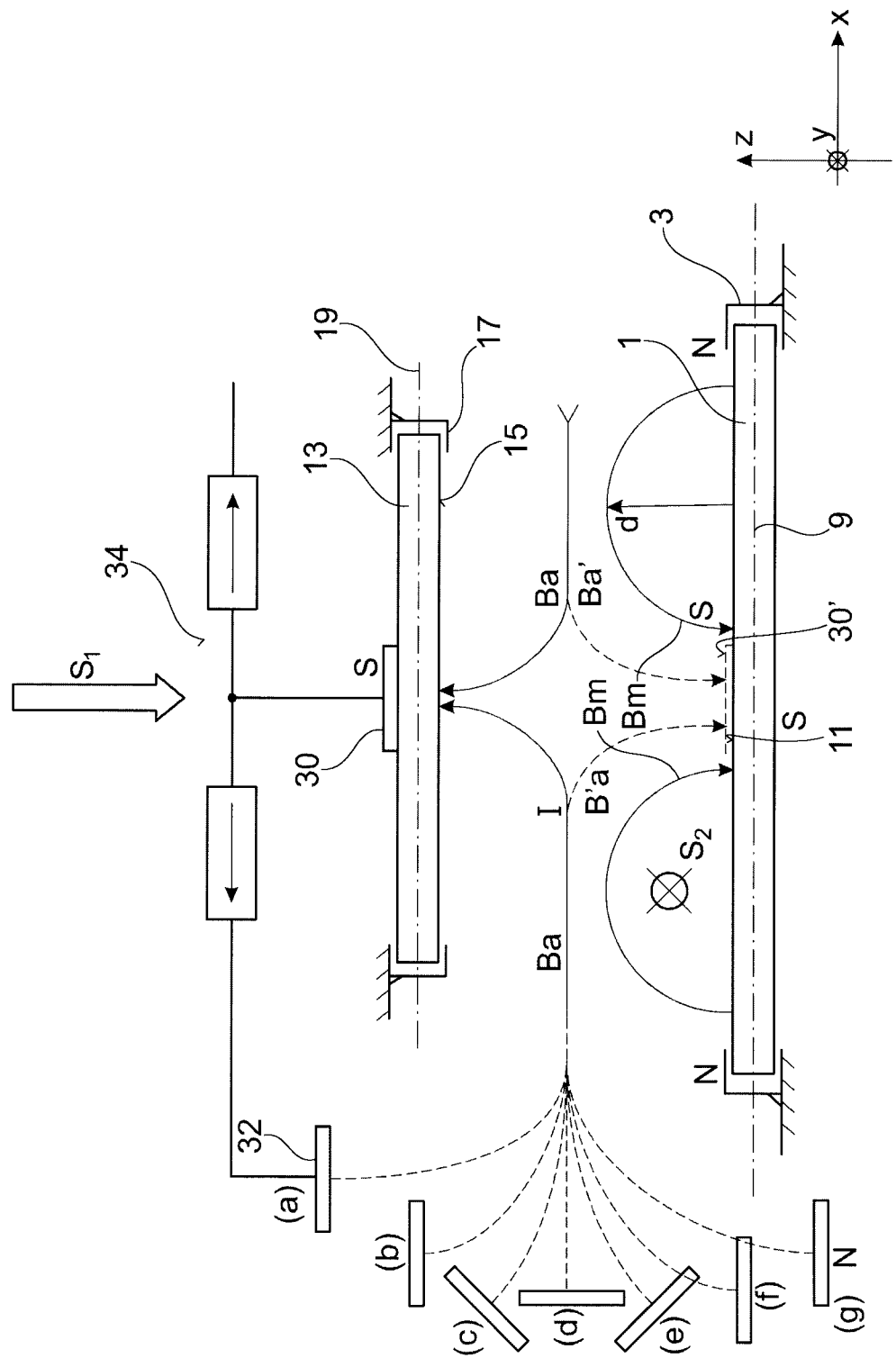
Figure 4:
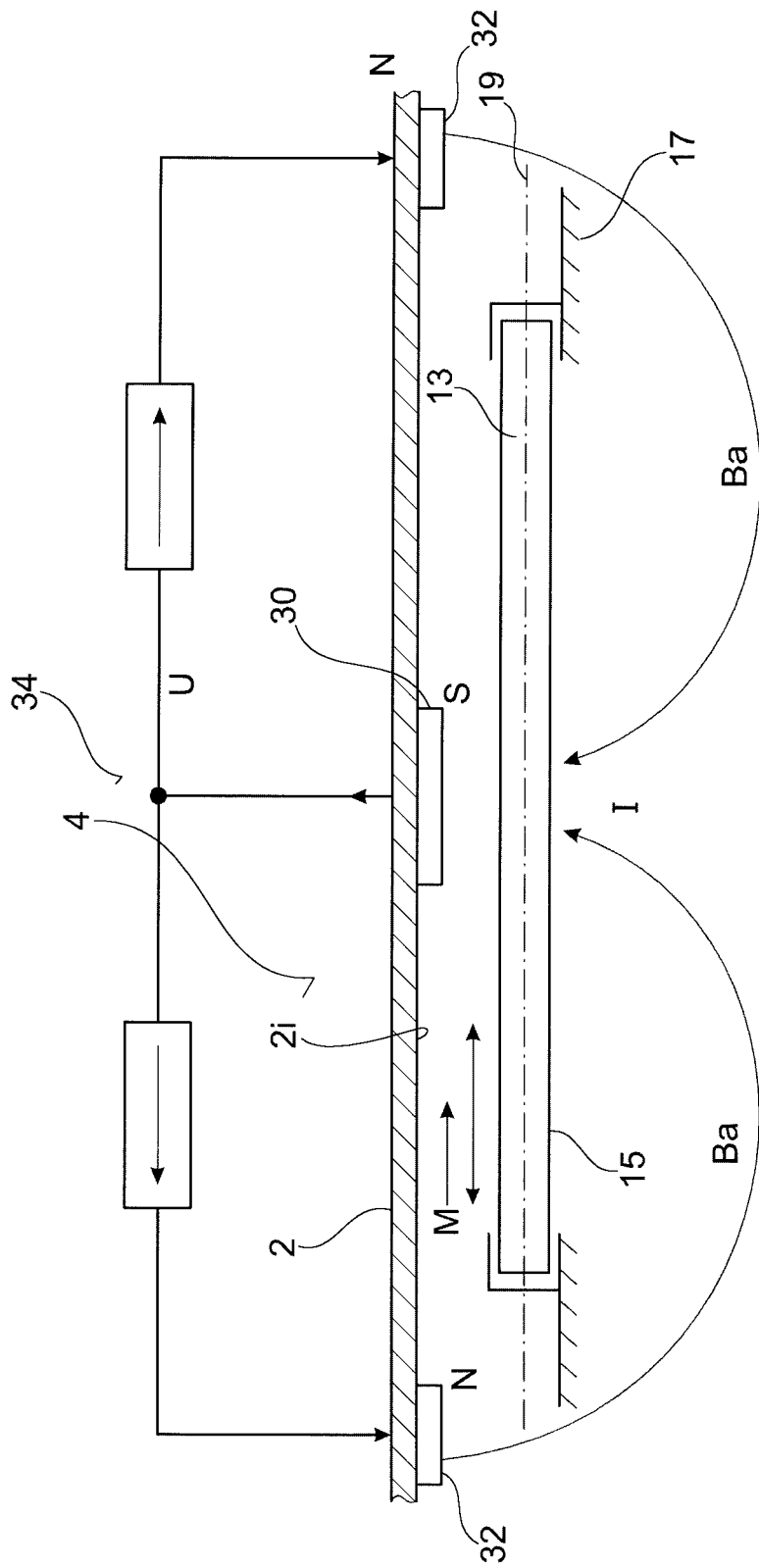
Figure 5:
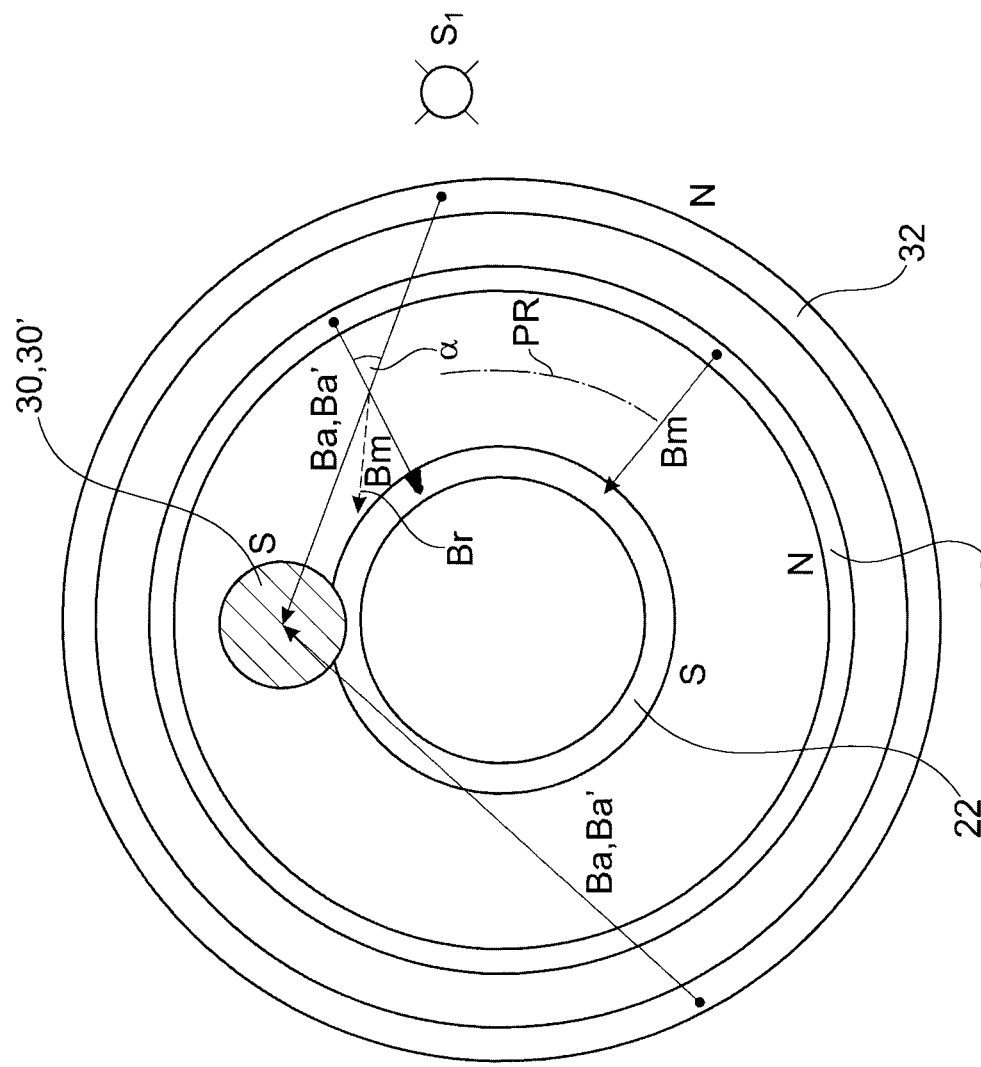
Figure 6:
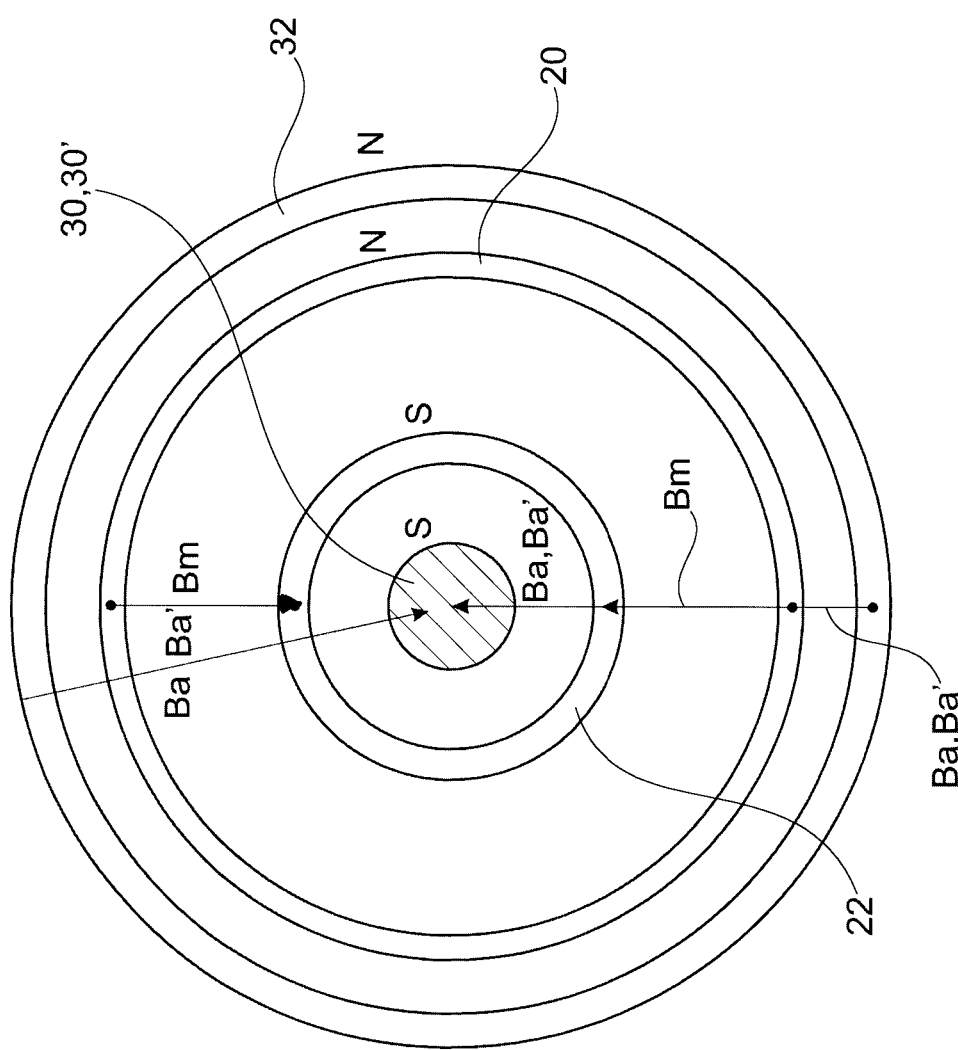
Figure 7:
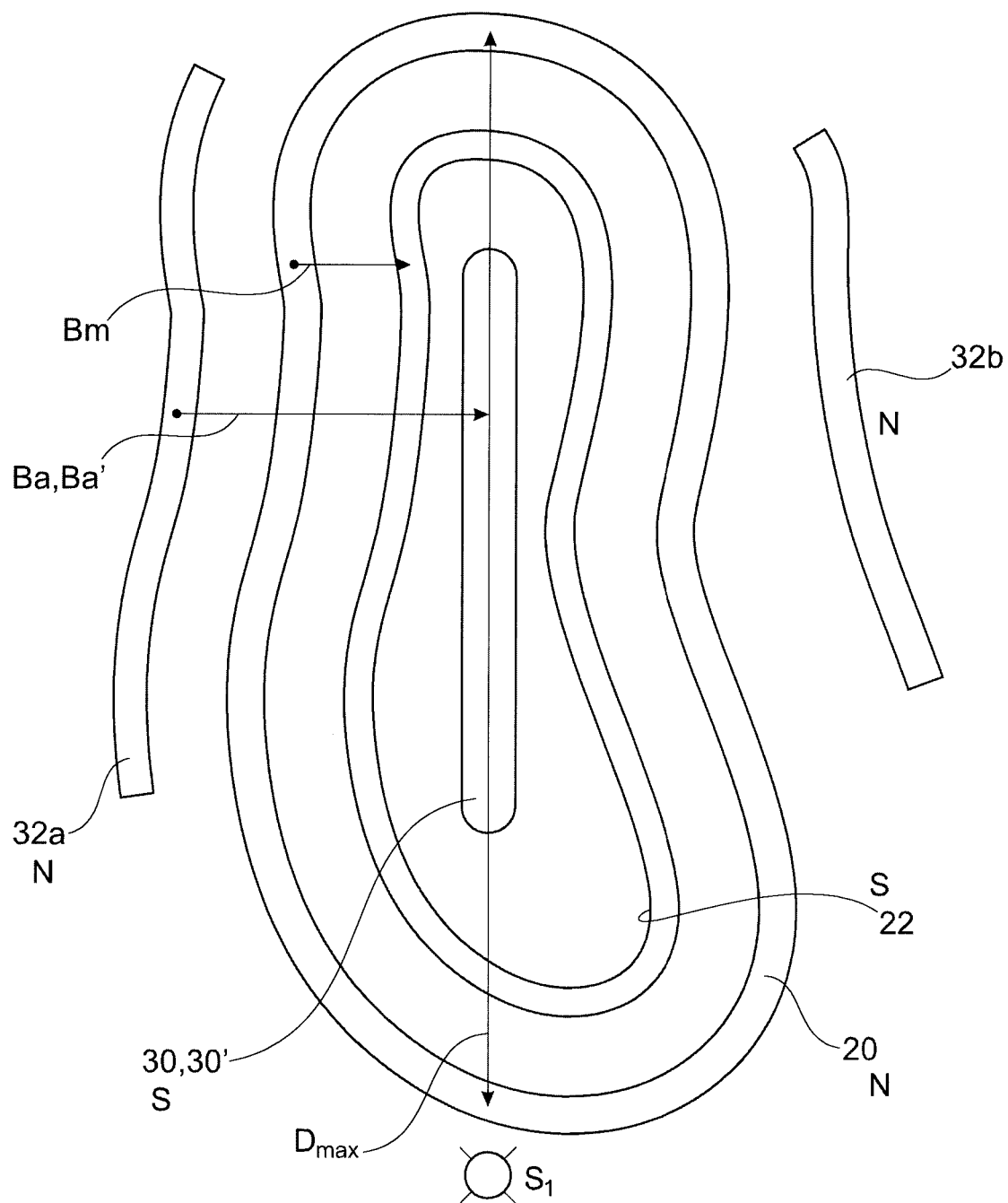
Figure 8:
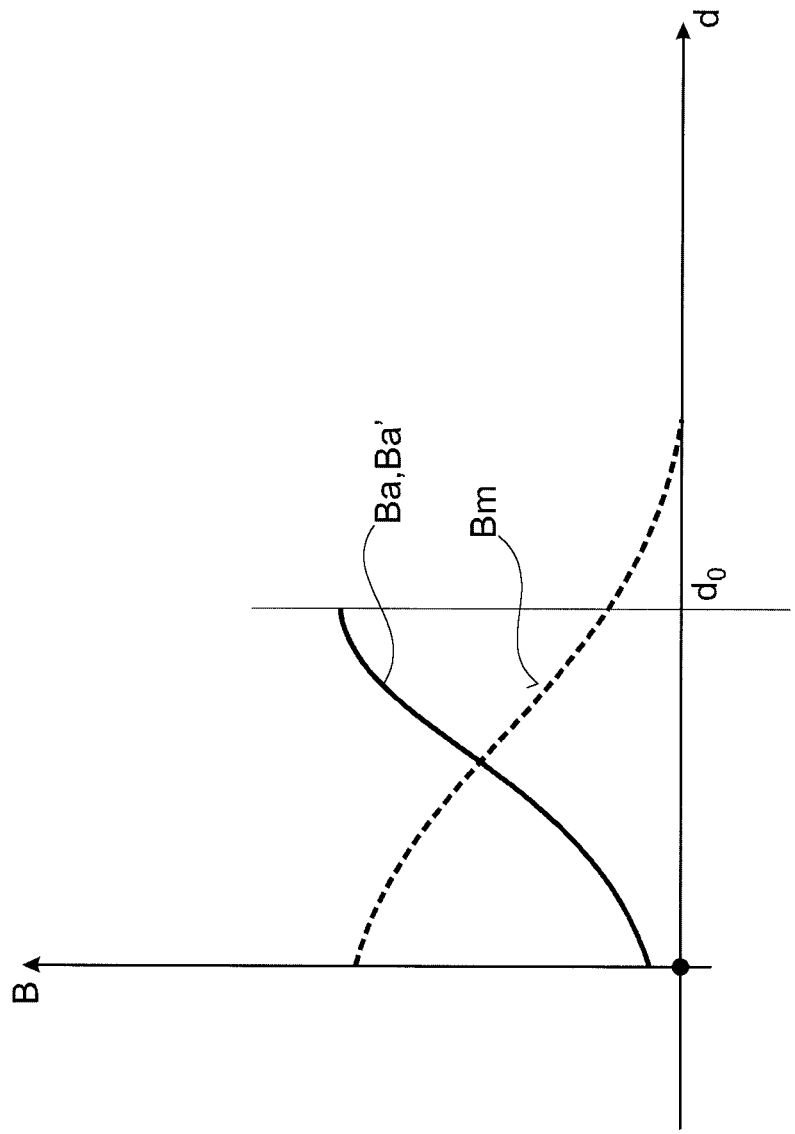

The invention shall be further exemplified with the help of figures. The figures show:

FIG. 1: A most simplified vacuum enclosure with a target and pole surfaces, so as to define the term "pole surfaces";

FIG. 2: Schematically and heuristically the generic approach according to the methods and apparatus of the present invention in a lateral view;

FIG. 3: In a representation in analogy to that of FIG. 2, schematically and simplified, different embodiments of the apparatus or different variants of the methods according to the invention with respect of generating the further magnetic field of FIG. 2;

FIG. 4: In a representation in analogy to that of FIG. 3 not showing the target, an embodiment or a variant according to the invention with respect of generating the further magnetic field adjacent the substrate;

FIG. 5: in a schematic and simplified top view a mutual positioning of the pole surfaces at an embodiment of the apparatus or at a variant of the methods according to the invention;

FIG. 6: in a schematic and simplified top view in analogy to that of FIG. 5, a mutual positioning of the pole surfaces at an embodiment of the apparatus or at a variant of the methods according to the invention;

FIG. 7: in a schematic and simplified top view in analogy to that of FIG. 5 or FIG. 6a mutual positioning of the pole surfaces at an embodiment of the apparatus or at a variant of the methods according to the invention especially with an eye on influencing layer deposition by the resulting magnetic field;

FIG. 8: qualitatively the distribution of magnetic field strengths in dependency from the spacing from the sputter surface towards the substrate for exploiting the resultant magnetic field as an alignment magnetic field.

Figure 9:
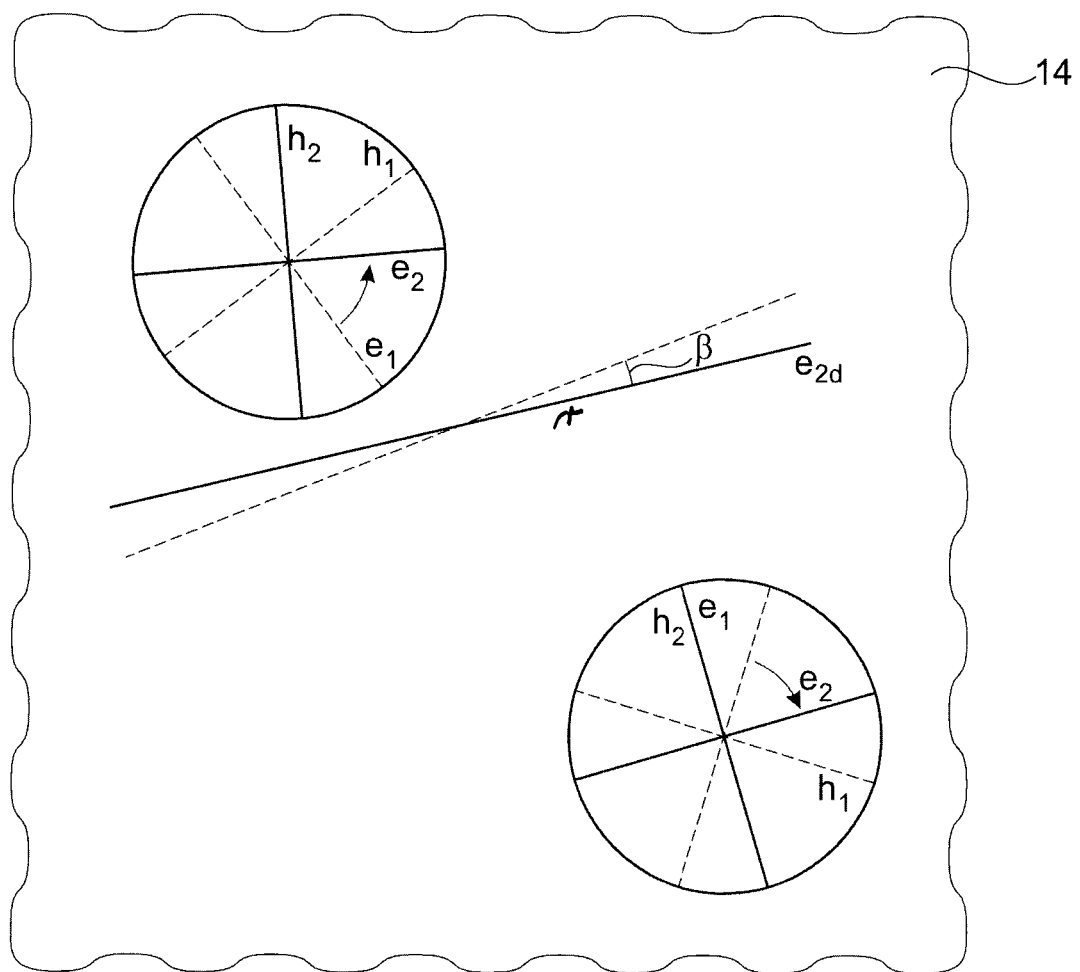
Figure 10:
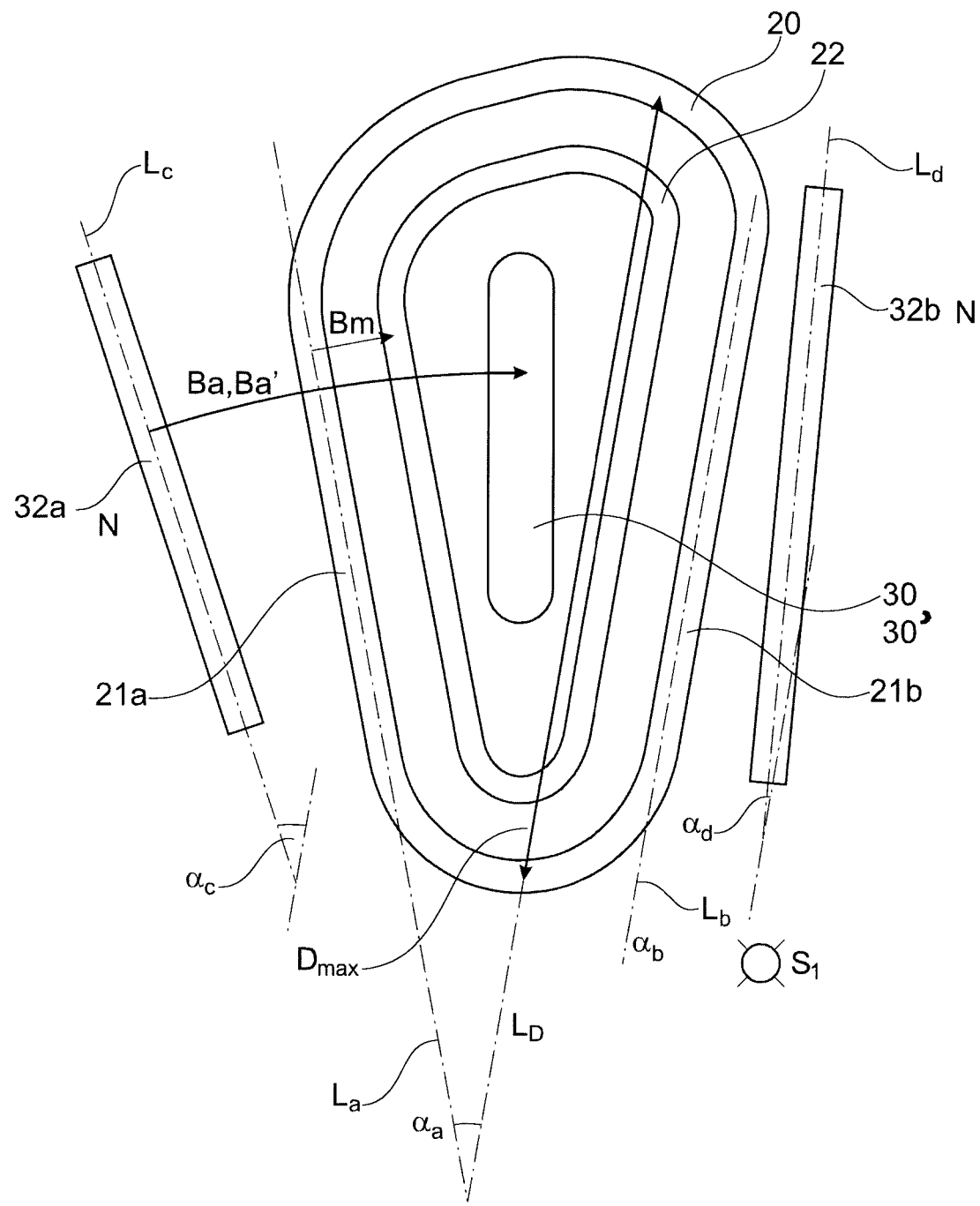
Figure 11:
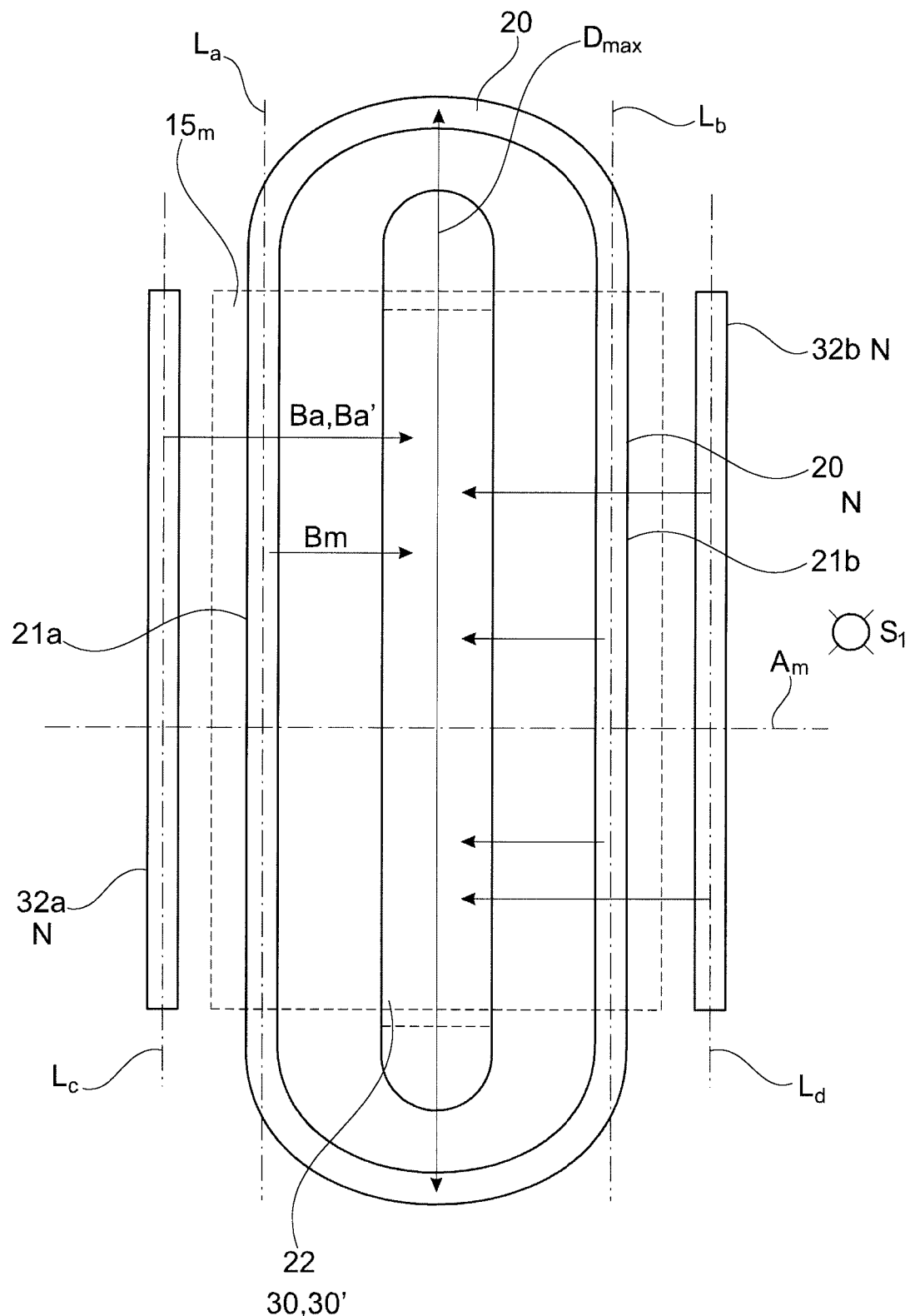
Figure 12:
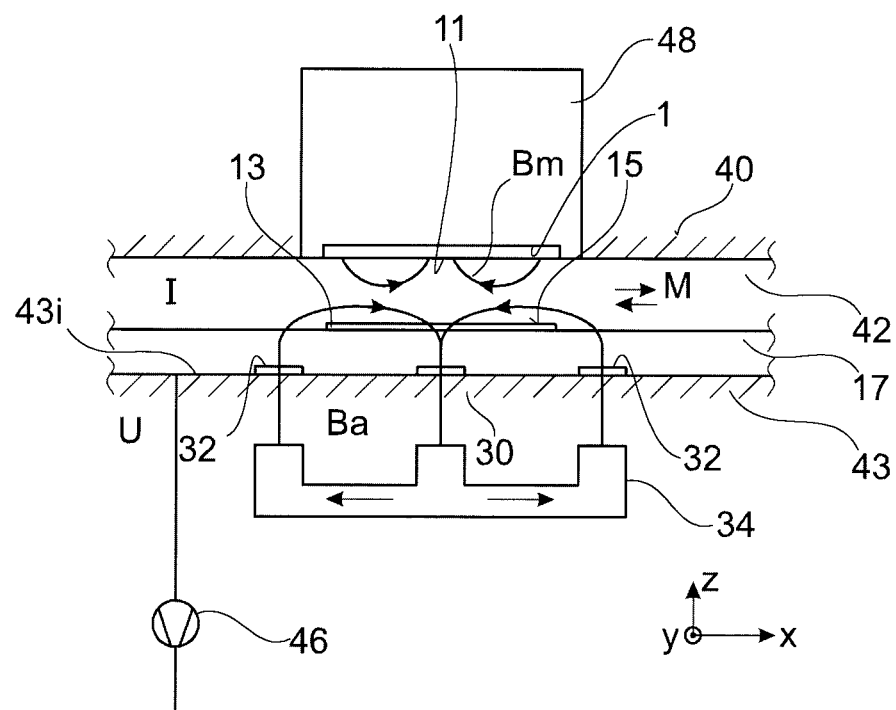
Figure 13:
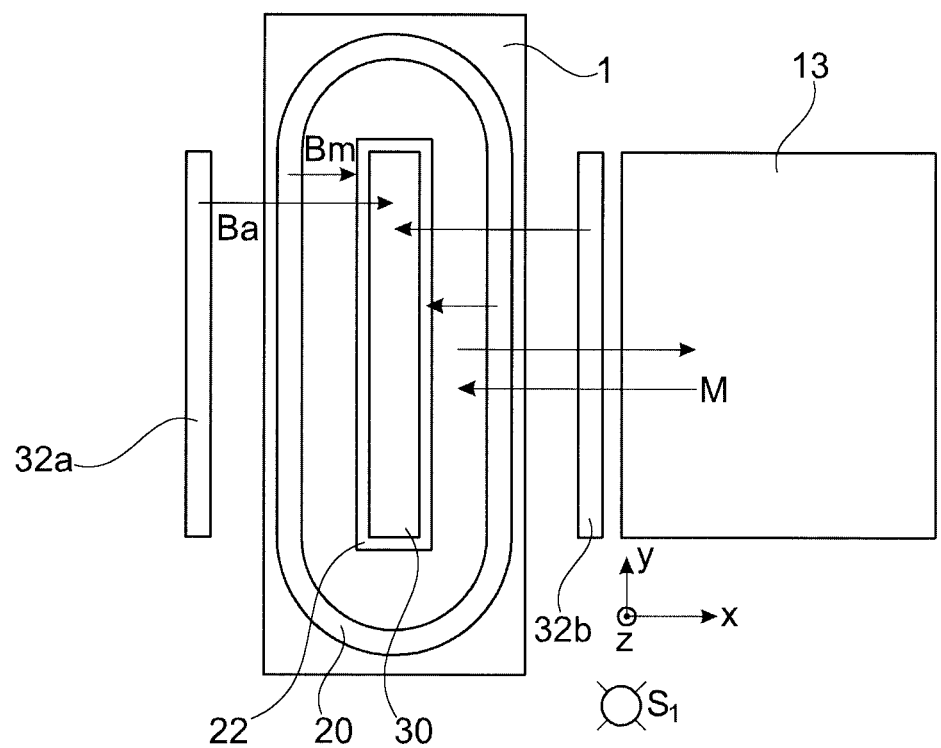
Figure 16:
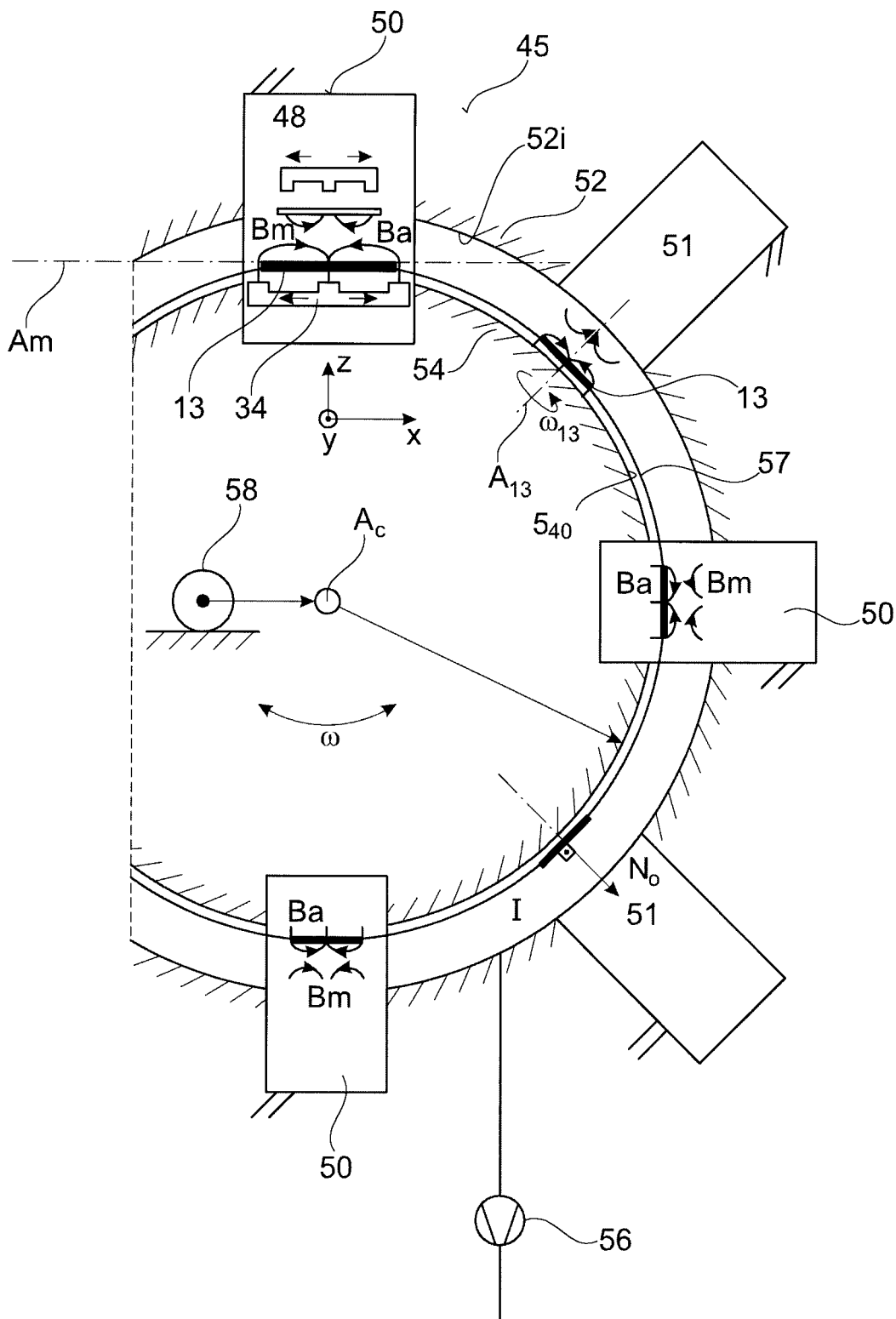
Figure 17:
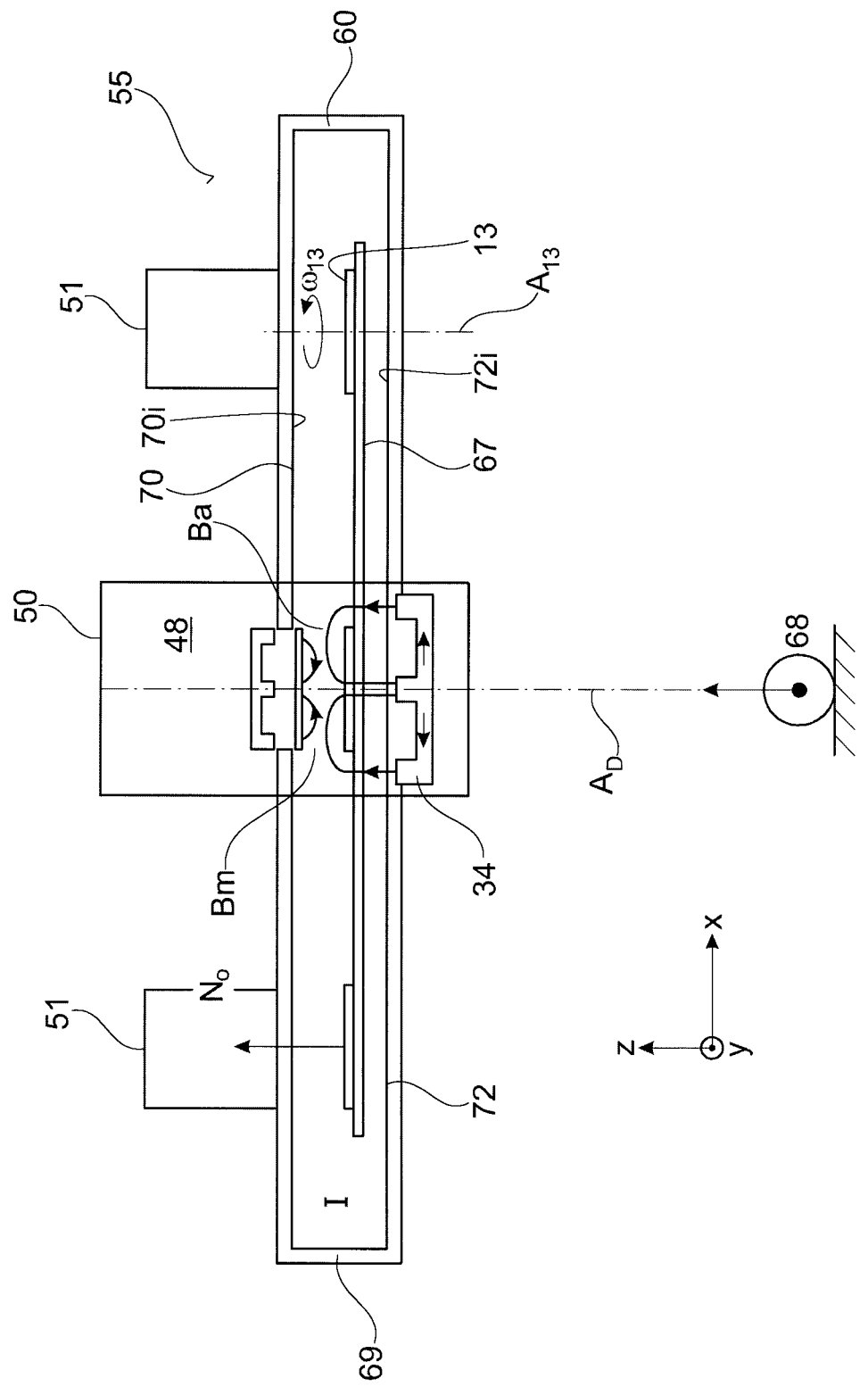
Figure 18:
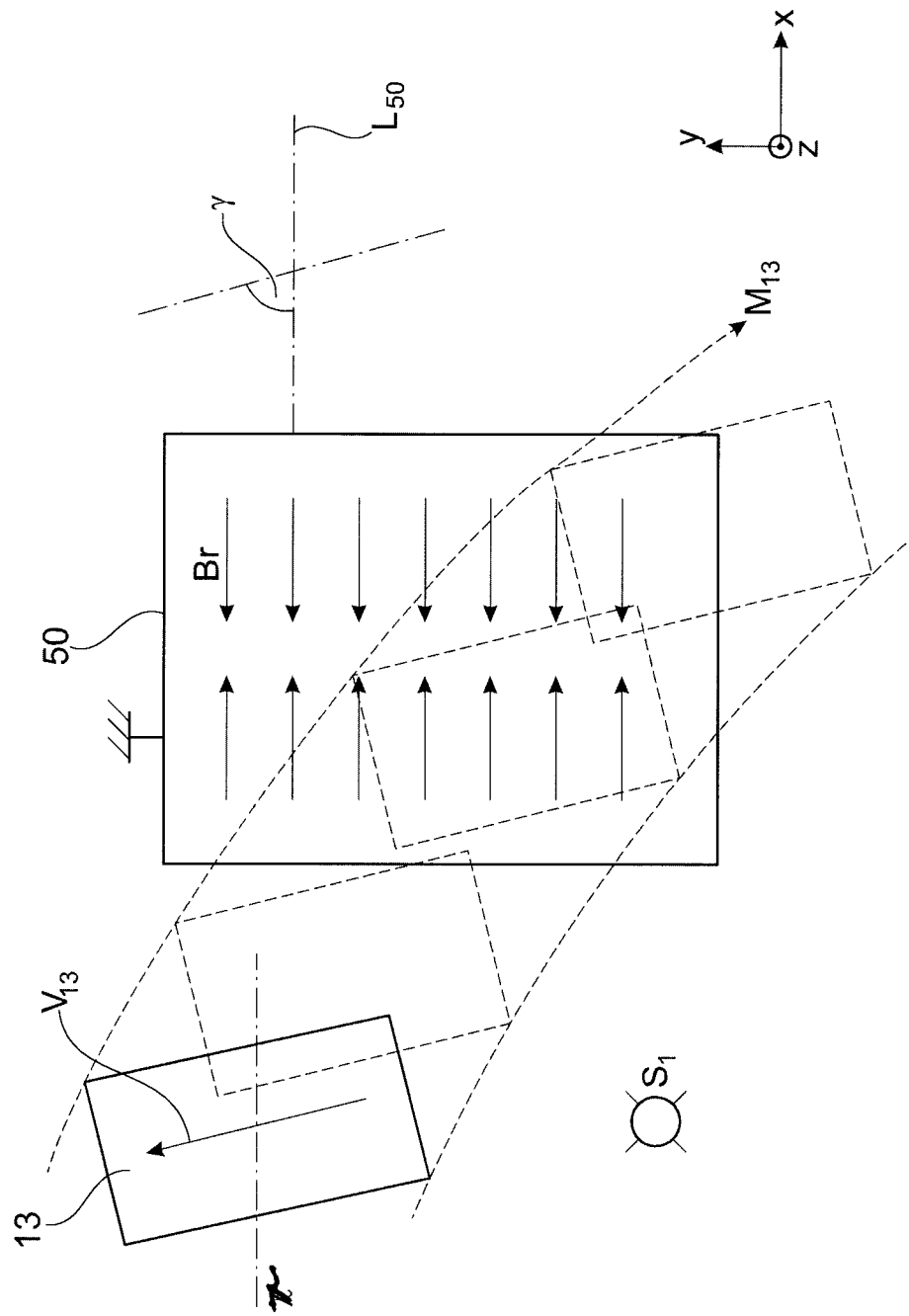
Figure 19:
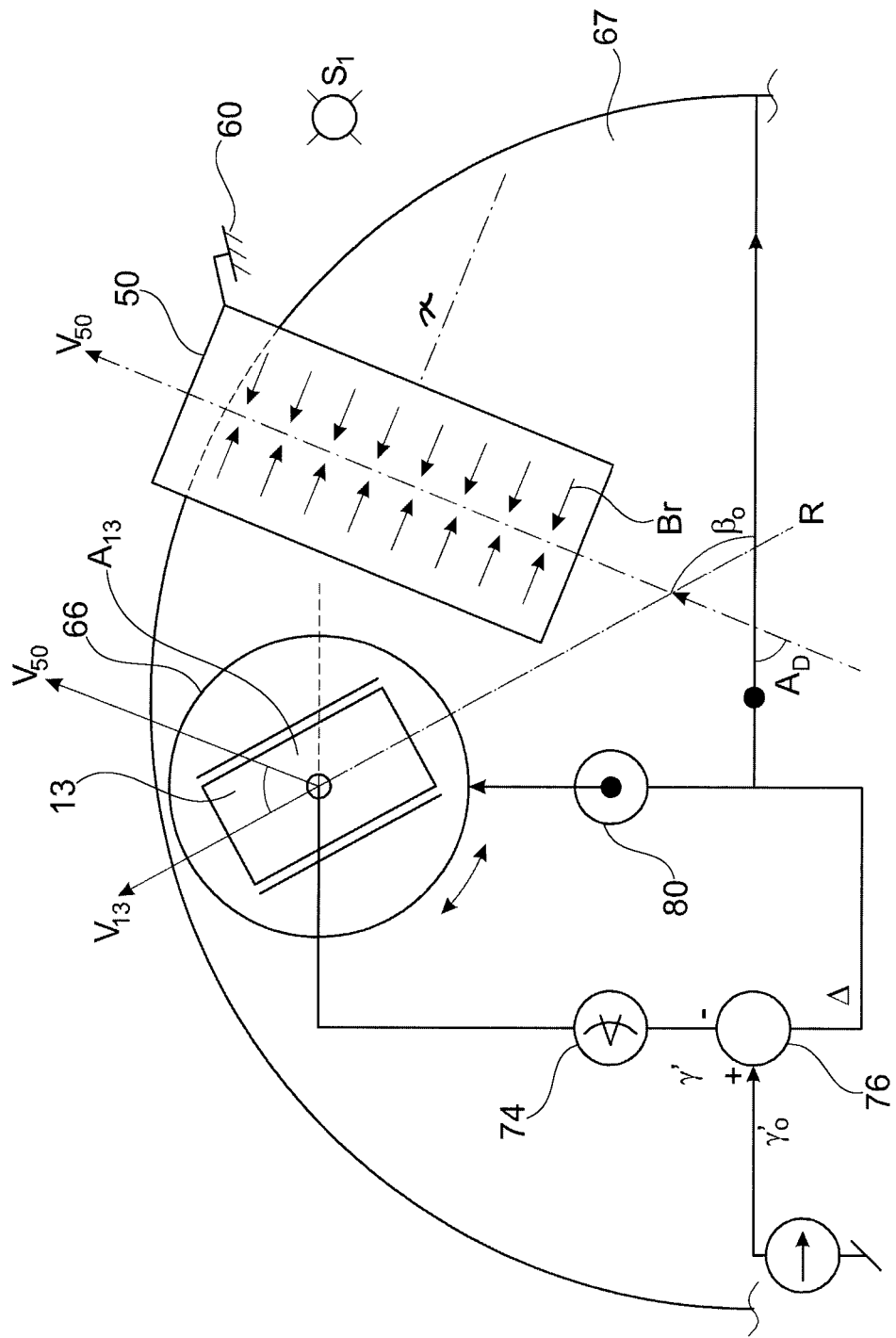

FIG. 9: in a top view, schematically and heuristically, aligning the magnetic anisotropy of a ferromagnetic layer as realized by embodiments and variants of the present invention;

FIG. 10: in top view, schematically and simplified, mutual positions and shapes of pole surfaces of an embodiment and variant of the invention;

FIG. 11: in a representation in analogy to that of FIG. 10 schematically and simplified mutual positions and shapes of pole surfaces of an embodiment and variant of the invention;

FIG. 12: in a lateral view, simplified and schematically an embodiment and variant of the invention;

FIG. 13: simplified and schematically, in top view, the mutual positions and shapes of the pole surfaces of the embodiment and variant of FIG. 12;

FIG. 14: An embodiment or variant of the invention in which multiple substrates are moved passing at least one sputtering apparatus according to the invention;

FIG. 15: An embodiment or variant of the invention in which multiple substrates are moved passing at least one sputtering apparatus according to the invention;

FIG. 16: schematically and simplified, in a top view, a vacuum treatment apparatus comprising at least one sputtering apparatus according to the invention and performing a method according to the invention;

FIG. 17: schematically and simplified, in a lateral view, a vacuum treatment apparatus comprising at least one sputtering apparatus according to the invention and performing a method according to the invention;

FIG. 18: schematically the spacial orientation of a substrate to be maintained with respect to the resultant magnetic field, so as to homogeneously align the magnetic anisotropy;

FIG. 19: schematically and simplified, in a top view, an orientation control for the substrates at an apparatus according to FIG. 17 in functional-block representation.

FIG. 2 shows schematically and heuristically i.e. in a non-scientific manner, the generic approach according to the method and apparatus of the present invention. Within the vacuum enclosure or recipient (not shown in FIG. 2) there is provided a target 1, mounted to a target holder 3. As schematically shown by the electric supply source 5 and anodes 7, the target 1 is electrically operated as a cathode. The target holder 3 defines a target plane 9 as a locus along which the target 1, mounted to the target holder 3, extends. The surface of target 1 sputtered off is the sputter surface 11.

A substrate 13 has a surface 15 to be sputter coated with a material comprising the sputtered off material from the target 1. The substrate 13 is mounted to a substrate holder 17 which defines a substrate plane 19, as a locus along which the substrate 13, held by the substrate holder 17, extends.

As perfectly known to the skilled artisan familiar with magnetron sputtering, there is generated along the sputter surface 11 and in a reaction space I a magnetron magnetic field $B_m$. The magnetron magnetic field $B_m$, as shown by its magnetic field lines, emanates from a first outer pole surface 20 shown by thickened lines. The first outer pole surface loops along the sputter surface 11 as seen in a direction S1 towards the sputter surface 11, i.e. in a top view towards the target 1.

The magnetron magnetic field $B_m$ impinges on one or more than one first inner pole surfaces 22 also shown by thickened lines in FIG. 2. The first inner pole surface 22 may be a single pole surface as shown in dash lines.

In FIG. 2a stationary magnetic dipole arrangement 24 is schematically shown only at the right-hand side of the magnetron magnetic field $B_m$-loop for clearness sake.

Seen in the direction S1 i.e. towards the sputter surface 11 or the target plane 9, the first outer pole surface 20 forms a closed loop around the one or more than one first inner pole surfaces 22. In FIG. 2 the first outer pole surface 20 has the magnetic N-polarity, whereas the at least one first inner pole surface 22 has S magnetic polarity. These polarities may be inversed.

The direction of the magnetron magnetic field $B_m$ may be considered in components parallel to the target plane 9, $B_{mx}$, and in components, $B_{mz}$, perpendicularly thereto.

It is perfectly known to the skilled artisan that the component $B_{mx}$ govern the electron trap effect of the magnetron and thus the respective plasma density adjacent to the sputter surface 11 and thus the respectively formed race track, i.e. the erosion profile in the sputter surface 11. The more pronounced these components $B_{mx}$ are along the sputter surface 11, the larger will be the race track and the better will be the exploitation of the target material.

To improve the effect of the magnetron magnetic field $B_m$ and according to the invention there is generated a further magnetic field $B_a$. As schematically shown in FIG. 2 this further magnetic field $B_a$ is generated in the reaction space I so that the resulting magnetic field $B_r$ considered at a locus in the reaction space I and resulting from superposition of $B_m$ and $B_a$ at said locus has larger components $B_{rx}$ parallel to the target plane 9 than the component $B_{mx}$ at that locus. As perfectly clear from FIG. 2 the further magnetic field $B_a$ must be polarized in a direction equal to the direction of polarization of the magnetron magnetic field $B_m$ in the direction x to achieve the addressed improvement. At every locus of the reaction space I where $B_a$ has a non-vanishing directional component $B_{ax}$ such improvement is achieved and thus along a predominant area of the sputter surface 11.

So as not to overload FIG. 2, FIGS. 3 and 4 show, in a representation in analogy to that of FIG. 2 different possibilities to generate the further magnetic field $B_a$.

The magnetic polarities of all pole surfaces which will be addressed are based on the polarities of the pole surfaces 20 and 22 for the magnetron magnetic field $B_m$ according to FIG. 2. All these magnetic polarities may be commonly inversed.

According to FIG. 3, the further magnetic field $B_a$ is generated between a second inner pole surface 30 and a second outer pole surface 32.

The second inner pole surface 30 is located opposite to the sputter surface 11 with respect to the substrate plane 19, e.g. behind the substrate 13. The second inner pole surface 30 is further aligned with a central area of the substrate holder 17 as will be discussed later and in any case inside the loop of the first outer pole surface 20 (see FIG. 2) seen in top view—S1—towards the target 1. In analogy to the first inner pole surface 22 also the second inner pole surface 30 may be subdivided in more than one respective pole surface areas.

The second outer pole surface 32 is located outside the loop of the first outer pole surface 20 (see FIG. 2) and again seen in direction S1. According to FIG. 3 and seen in a direction y parallel to the target plane 9 and thus in direction of propagation of the magnetron magnetic field loop, as shown by S2, the second outer pole surface or surfaces 32 may be located:

(a) opposite to the sputter surface 11 or the target plane 9 with respect to the substrate plane 19;
(b) aligned with the substrate plane 19;
(c) between the substrate plane 19 and the target plane 9 and closer to the substrate plane 19 than to the target plane 9;
(d) centered with respect to the substrate plane 19 and the target plane 9 and thus equidistant from the substrate plane 19 and the target plane 9;
(e) between the substrate plane 19 and the target plane 9 and closer to the target plane 9 than to the substrate plane 19;
(f) aligned with the target plane 9;
(g) opposite to the substrate plane 19 with respect to the sputter plane 9.

As addressed above the one or more than one second outer pole surfaces 32 are nevertheless outside the loop of the first outer pole surface 20, seen in direction S1.

Still seen in this direction S1, the second outer pole surface 32 may form a loop along the first, looping outer pole surface 20 (see FIG. 2): In this case there is provided a single second outer pole surface 32.

Alternatively, or possibly additionally, two or more than two distinct second outer pole surfaces 32 may be provided along the loop of the first outer pole surface 20.

Please note, that in FIG. 3 the second outer pole surfaces 32 at the different possible locations (a) to (g) are not shown for the right hand-side part of the further magnetic field $B_a$. Please further note that under a general aspect, the positions as shown by (a) to (g) of a single second outer pole surface 32 or of more than one second outer pole surfaces 32 may vary along the loop of the first outer pole surface 20 i.e. there may be provided second outer pole surfaces or a single second outer pole surface at different of the positions (a) to (g).

In FIG. 3a magnetic dipole arrangement generating the further magnetic field $B_a$ is shown at 34.

The pole surfaces 32 and 30 are again shown schematically in FIG. 3 by thickened lines which is also valid for representation of pole surfaces in following figures.

An alternative possibility to tailor the further magnetic field $B_a$ is shown in FIG. 3 at $B_a'$ in dash lines. Here the second inner pole surface 30' is or are provided as a part of the sputter surface 11. Please note that a combination of generating the further magnetic field by $B_a$ and by $B_a'$ is also possible. In any case the various possibilities (a) to (g) for the second one or more than one second outer pole surfaces 32 are valid irrespective of generating $B_a$ and/or $B_a'$.

As apparent, the present invention makes use of a further magnetic field $B_a$, $B_a'$, additionally to a magnetron magnetic field $B_m$, which latter, per se, is commonly known. This necessitates an additional magnetic dipole arrangement as of 34 in FIG. 3. In one variant and embodiment of the invention such additional magnetic dipole arrangement is located outside the wall 2 of the vacuum enclosure 4 (see FIG. 1).

FIG. 4 shows, in a representation in analogy to that of FIG. 2 or 3, as an example such a variant and embodiment, thereby generating the further magnetic field in the variant $B_a$, with the second outer pole surface or surfaces 32 in a position according to (a) of FIG. 3. The magnetic dipole arrangement 34 is provided outside the wall 2 of the vacuum enclosure 4. The target holder, the target and the magnetron magnetic field with respective pole surfaces are not shown in FIG. 4.

The wall 2 of the vacuum enclosure 4 separates sputter processing vacuum from a different gaseous atmosphere U, especially ambient atmosphere. The one or more than one second outer pole surfaces 32 reside on the inner, process-vacuum exposed surface $2_i$ of the wall 2. The second inner pole surface 30 on that surface $2_i$ as well. The further magnetic dipole arrangement 34 is located outside the vacuum sputter atmosphere as prevailing in the reaction space I, e.g. in ambient atmosphere.

The generic concept of providing the magnetic dipole arrangement 34 for the further magnetic field $B_a$ and/or $B_a'$ separate from the vacuum sputtering atmosphere in the reaction space I may be realized for any variant of generating the further magnetic field $B_a$, $B_a'$ according to FIG. 3 and the description thereof.

The example according to FIG. 4 i.e. having the at least one second outer pole surface 32 as well as the at least one second inner pole surface 30 along the inner surface $2_i$ of a part of the wall 2 of the vacuum enclosure 4 adjacent to the substrate plane 19, is especially suited if one or more than one substrates 13 with the respective substrate holders 17 are to be moved pass the target 1 as schematically shown by bi-directional or mono-directional arrows M in FIG. 4.

Up to now we have not finally considered the mutual positioning of the pole surfaces for the magnetron magnetic field $B_m$ and for the further magnetic field $B_a$, Ba' as seen in direction S1. In fact, this positioning may be selected substantially independently from the mutual positions of the pole surfaces as seen in direction S2 according to FIG. 3. With respect to the addressed mutual positioning seen in direction S1 we have only described, that the second inner pole surface or surfaces 30 (FIG. 3) should be placed inside the looping first outer pole surface 20 (FIG. 2) and that the at least one second outer pole surface (FIG. 3) should be outside the looping first outer pole surface 20.

FIG. 5 exemplifies schematically an embodiment of mutual positioning of the pole surfaces, seen in direction S1. The looping first outer pole surface 20, is, as an example, forming a circular loop of magnetic polarity N. Inside the loop of the first outer pole surface 20 the inner pole surface 22 (see FIG. 2) is provided, with magnetic polarity S. In the example of FIG. 5 the one first inner pole surface 22 forms a circular loop, concentric to the loop of the first outer pole surface 20. The second outer pole surface 32 is, in this example looping as well concentrically to and outside the loop of the first outer pole surface 20 thus, in this example, at a constant spacing from the loop of the first outer pole surface 20.

The at least one second inner pole surface 30 or 30' (see FIG. 3), here just one second inner pole surface, is positioned inside the loop of the first outer pole surface 20 but, here, at a randomly selected position.

The directions of the magnetron magnetic field $B_m$ and of the further magnetic field $B_a$ or $B_a'$ are heuristically represented by their magnetic field lines, seen in direction S1. As may be seen, the magnetron magnetic field—$B_m$—directions and the directions of the further magnetic field $B_a$, $B_a'$ intersect at most loci in the reaction space I seen in direction S1 with a respective variable angle α.

Although such a variant or embodiment falls under the generic approach according to the invention, it might be seen that the resultant magnetic field $B_r$ has a direction which is tilted with respect to the propagation direction PR of the magnetron race track.

Thus, the magnetron effect is on one-hand improved by increasing the magnetic field component parallel to the target plane but is on the other hand disturbed by accelerating electrons away from the magnetron propagation direction PR, out of the magnetron electron trap.

In a further variant and embodiment of the invention according to FIG. 6 the directions of the magnetron magnetic field $B_m$ and of the further magnetic field $B_a$, $B_a'$ are mutually parallel as seen in direction S1. The variant or embodiment of FIG. 6 differs from that of FIG. 5 only in that the at least one second inner pole surface 30, 30' is inside the loop of the first inner pole surface 22. In an alternative embodiment or variant, the first—22—and the second 30, 30' inner pole surfaces mutually overlap.

With an eye on FIG. 5, we propose to realize α to be within the limits:

$$0 \leq \alpha \leq 2°.$$

As may be seen e.g. from FIGS. 2, 3, 4 the magnetic field $B_r$, resultant from superposition of the magnetron magnetic field $B_m$ and of the further magnetic field $B_a$, $B_a'$ is also present along the surface 15 to be sputter-coated of the substrate 13. Thus, additionally to improving magnetron sputtering from the target 1 the methods and apparatus according to the invention may be tailored to specifically influence layer deposition on the surface 15 of the substrate 13 to be sputter-coated.

As already apparent e.g. from FIG. 3, the influence of the further magnetic field $B_a$, $B_a'$ on the resultant magnetic field $B_r$ may be tailored to be more pronounced adjacent to the substrate plane 19 than adjacent to the target plane 9.

In one variant and embodiment the resultant magnetic field $B_r$, resulting from superposition of the magnetron magnetic field $B_m$ and of the further magnetic field $B_a$, $B_a'$, is exploited to establish i.e. to control the direction of magnetic anisotropy in a ferro magnetic layer as sputter deposited to be unidirectional, at least in a predominant part of the layer extent. In this variant and embodiment, the target 1 mounted or to be mounted on the target holder 1 is of a ferromagnetic material.

The generic approach of such a variant of the methods and embodiments of the apparatus according to the invention is shown in FIG. 7. This figure shows mutual positions of the pole surfaces seen in direction S1. The shape of the pole surfaces as shown in FIG. 7 is hardly a shape exploited in praxis, but shall show that, according to specific applications, one is largely free to tailor the respective shapes.

For the respective pole surfaces the same reference numbers are used in FIG. 7 as were used throughout the description to now.

Generically, the looping first outer pole surface 20 may have a loop shape as needed e.g. for a specific shape of the target 1, of the substrate 13 etc. Accordingly, the first inner pole surface or surfaces 22, as a loop or as an unitary or more than one unitary pole surfaces, is adapted to the specific shape of the loop of the first outer pole surface 20.

The loop of the first outer pole surface 20 has a maximum diameter $D_{max}$.

On both sides of the maximum diameter $D_{max}$ and outside the loop of the first outer pole surface 20 the second outer pole surface 32 is realized by two or more than two distinct pole surfaces 32a and 32b extending along respective distances along the maximum diameter $D_{max}$. The shapes and the respective positions of the distinct second outer pole surfaces 32a and 32b is again selected to achieve a desired resultant magnetic field $B_r$ from the superposition of magnetron magnetic field $B_m$ and of the further magnetic field $B_a$, $B_a'$, which may now be said an "alignment magnetic field".

With an eye on FIG. 3, for the exploitation of the resultant magnetic field $B_r$ for aligning the direction of magnetic anisotropy along a ferromagnetic material layer deposited by the sputtering on the substrate 13, the substrate 13 and especially its surface 15 to be sputter coated is located in the rather far field area with respect to the magnetron magnetic field $B_m$ and rather in the near field area of the further magnetic field $B_a$, $B_a'$. This is schematically and qualitatively represented in FIG. 8. The d coordinate addresses the distance from the sputter surface 11 of target 1 in vertical direction up to the value $d_o$ according to the position of the surface 15 to be sputter coated. The strength of the field components of the magnetron magnetic field Bm parallel to the substrate plane 19 and to the target plane 9, diminishes towards $d_o$, whereas the respective strength of components of the further magnetic field Ba, Ba' rises toward $d_o$. This may be achieved by appropriately selecting, with an eye on FIG. 3, the positions of the second outer pole surfaces 32, especially according to one of the variant (a), (b), (c).

Thereby, one still achieves that the further magnetic field $B_a$, $B_a'$ improves magnetron sputtering but, additionally, provides for unidirectional alignment, parallel to a directional axis, of the magnetic anisotropy along the ferromagnetic material layer which is sputter deposited on surface 15 of the substrate 13.

Please note that, also with an eye on FIG. 3, the embodiment or variant of positioning the second outer pole surfaces 32 according (a), achieves, on one hand, the desired distribution of field strength, according to FIG. 8 and, on the other hand, allows to provide the dipole arrangement 34 (see FIG. 4) outside the vacuum enclosure 4 with the wall 2.

As apparent from the discussion of FIGS. 5 and 6, the further magnetic field $B_a$, $B_a'$ should be as parallel as possible to the magnetron magnetic field $B_m$, seen in direction S1. This also prevails if the further magnetic field $B_a$, $B_a'$ is exploited as an alignment magnetic field i.e. with the purpose of aligning the direction of magnetic anisotropy in and along a ferromagnetic material layer as sputter-deposited, with respect to a predetermined reference directional— i.e. or orientation-axis over the substrate i.e. over the surface-extent of the layer as being deposited.

In FIG. 9 there is heuristically shown the effect of the resultant magnetic field $B_r$ on the magnetic anisotropy in the ferromagnetic layer as sputter deposited. In the ferromagnetic material of layer 14, being deposited or as deposited, without applying the alignment field $B_r$, the magnetic anisotropy is inhomogeneous distributed as schematically shown by easy axis $e_1$ and hard axis $h_1$.

Applying the resultant magnetic field $B_r$ according to the invention along an axis r and homogeneously over a predominant area of the sputter-deposited layer material, the magnetic anisotropy in the material of layer 14 is made unidirectional, i.e. the easy axes and, respectively, the hard axes become aligned in a respective unitary direction, $e_{2d}$, as shown by $e_2$ and $h_2$. Thereby the intersecting angle β of the unidirectionally aligned anisotropy e.g. of the easy axes to the direction r of the applied resultant magnetic field $B_r$ is getting very close to 0°.

FIG. 10. shows in a representation in analogy to that of FIG. 7a further embodiment and variant of the invention. According to this variant and embodiment, the first outer pole face 20 has a first leg $21_a$ on one side of the maximum diameter $D_{max}$ and a second leg $21_b$ on the other side of the maximum diameter $D_{max}$. Both legs $21_a$ and $21_b$ extend along respective linear loci $L_a$ and $L_b$. The legs per se need not necessarily be linear i.e. straight, but may be curved forth and back or be bent with respect to the respective linear loci $L_a$, $L_b$. The maximum diameter extends along the liner locus $L_D$.

$L_a$ intersects $L_D$ at an angle $\alpha_a$, $L_b$ intersects $L_D$ at an angle $\alpha_b$ which is in FIG. 10, about 0°.

Different further shapes are possible:
(1) $\alpha_a=\alpha_b$ the two legs $21_a$ and $21_b$ extend along parallel loci $L_a$, $L_b$;
(2) $\alpha_a=\alpha_b=0°$: If the legs per se are additionally linear and mirrored at $D_{max}$, there results a shape of the loop of the first outer pole surface 20 as shown in FIG. 11.

In the embodiment of FIG. 11 the magnetron magnetic field $B_m$ appears perpendicular to the diameter $D_{max}$ along a predominant length extent of $D_{max}$, seen in direction S1.

According to FIG. 10 the two parts $32_a$ and $32_b$ of the second outer pole surface 32 extend along respective linear loci $L_c$ and $L_d$. These parts per se need not necessarily be linear, but may be curved forth and back or be bent with respect to the respective linear loci $L_c$, $L_d$.

$L_c$ intersects $L_D$ at an angle $\alpha_c$, $L_d$ intersects $L_D$ at an angle $\alpha_d$.

Different further forms are possible:
(3) $\alpha_c=\alpha_d$, the two parts $32_a$ and $32_b$ extend along parallel loci $L_a$, $L_b$;
(4) $\alpha_c=\alpha_d=0°$: If the parts $32_a$ and $32_b$ per se are additionally linear and mirrored at $D_{max}$ and, further additionally, all conditions addressed above under (2) prevail, there results a shape of the loop of the first outer pole surface 20 as well as a shape and positioning of the parts $32_a$ and $32_b$ of the second outer pole surface 32 as shown in FIG. 11.

In this variant and embodiment of the invention, and especially with a course of magnetic field strength as schematically shown in FIG. 8 there results:
a) the magnetron effect is significantly improved by the further magnetic field $B_a$, $B_a'$;
b) the further magnetic field $B_a$, $B_a'$ may be or is exploited as an alignment field as was addressed above.

In FIG. 11 the area 15m of the substrate 13 which is sputter-coated with a ferromagnetic material and along which the directions of magnetic anisotropy become aligned unidirectionally is shown in dash line.

Further please note, that, as shown in FIG. 11, the first and second inner pole surfaces 22, 30, 30', may, generically, be mutually overlapping unitary surfaces or might be realized by a single common pole surface.

As we have discussed in context e.g. with FIG. 3, providing the second outer pole surfaces 32 according to (a) and the second inner pole surfaces as shown at 30, opens the possibility to flexibly position the dipole arrangement 34 for generating the further magnetic field $B_a$ remote from the magnetron which comprises the target 1 and the dipole arrangement generating the magnetron magnetic field $B_m$. The dipole arrangement 34 may be located on one side of the substrate 13 to be sputter coated, the magnetron on the other side. Especially the dipole arrangement 34 may be positioned outside the reaction space I wherein the substrate 13 is sputter coated.

This leads to a variant and embodiment according to the invention as schematically shown in a simplified manner in FIG. 12.

The vacuum enclosure 40 has two opposite walls 42 and 43 which limit the reaction space I.

As schematically shown by vacuum pump 46, the reaction space I is operated on sputtering atmosphere conditions. The substrate 13 is, in sputtering operation, held on the substrate holder 17. The magnetron 48, including the target 1 and the magnetron dipole arrangement (not shown) for generating the magnetron magnetic field $B_m$ along the sputter surface of the target 1 is mounted along the wall 42.

The magnetic dipole arrangement 34 is mounted behind or along the inner surface $43_i$ which forms the interface between the vacuum processing atmosphere in the reaction space I and non-vacuum processing atmosphere, especially ambient atmosphere U. Reference number 32 addresses again the second outer pole surfaces, reference number 30 the second inner pole surfaces according to FIG. 3. This arrangement is especially suited if the one substrate 13 or more than one substrates 13 with the respective substrate holder 17 is/are drivingly movable as shown with the double arrow M along the reaction space I and across the target 1, be it in a linear movement or in a circular movement as will be addressed later.

FIG. 13 shows, again schematically and simplified the mutual positioning and the shapes of the pole surfaces realized at the embodiment or variant of the invention as shown in FIG. 12. In view of the explanations given to FIG. 11 the positioning and the shapes of the pole surfaces in FIG. 13 need no further explanations.

It may be noted that the movement M of the one or more than one substrates 13 is parallel to the further magnetic field $B_a$ as well as to the magnetron magnetic field $B_m$, seen in the direction S1 which accords with the z-coordinate direction, so that this arrangement is perfectly suited to establish in a ferromagnetic material layer, sputter deposited on the substrate or substrates 13, the unidirectional magnetic anisotropy as was addressed over the entire surface of the one or more than one substrates 13.

FIG. 14 shows most schematically substrates 13 according to a variant of the methods or according to an embodiment of the apparatus of the invention, which are drivingly rotatable around a rotational axis $A_r$. Thereby the normals n on the substrate planes of respective substrate holders (not shown) intersect the axis $A_r$ at an angle φ which is between 45° and 0°, both limits included. If the angle φ is 0° then the normals n are parallel to the axis $A_r$, the rotational axis $A_r$ is perpendicular to the respective substrate planes, which are arranged along a plane-locus LP.

FIG. 15 shows most schematically substrates 13 according to a variant of the methods or according to an embodiment of the apparatus of the invention, which are drivingly rotatable around a rotational axis $A_r$. Thereby the normals n on the substrate planes of respective substrate holders (not shown) intersect the axis $A_r$ at an angle φ which is between 45° and 90°, both limits included. If the angle φ is 90° then the normals n are perpendicular to the axis $A_r$, the rotational axis $A_r$ is parallel to the respective substrate planes, which are arranged along a cylinder locus LC.

In the variant or embodiment of FIG. 14 the rotational axis $A_r$ may especially be perpendicular to the target plane for target 1 whereas in the variant or embodiment of FIG. 15 the rotational axis may especially be parallel to the target planes of targets 1.

FIG. 16 shows schematically and simplified a vacuum treatment apparatus 45 according to the invention and performing a sputtering method or substrate manufacturing method according to the invention. Principally it is constructed according to the variant or embodiment of FIG. 15 with φ=0° and the axis $A_r$ parallel to the respective target planes. The vacuum treatment apparatus 45 comprises at least one sputtering and alignment apparatus also called alignment station 50 according to the invention and according to the variant or embodiment of the FIGS. 11 to 13, possibly also according to the variant or embodiment of FIG. 10. The vacuum treatment apparatus 45 comprises an outer stationary cylinder 52 with an axis $A_C$ and with an inner cylinder-surface $52_i$ and, coaxially to axis $A_C$, an inner stationary cylinder 54 with an outer surface $54_o$. The inner surface $52_i$ and the outer surface $54_o$ commonly define a cylindric reaction space I pumped by a pumping arrangement 56.

Within the cylindric reaction space I a substrate holder carrousel 57 is rotatable—ω—around axis $A_C$, controllably driven by a drive 58. The substrate holder carrousel 57 holds a multitude of substrates 13 to be vacuum treated. With an eye on the sputter and alignment stations 50, the magnetron 48 is e.g. mounted to the outer cylinder 52, whereas the dipole arrangement 34 for generating the alignment magnetic field $B_a$ is mounted to the inner cylinder 54, outside the reaction space I. Every area of the substrates 13 passes the sputter and alignment station 50 with a movement direction which is parallel to $B_a$ and $B_m$ seen in z direction, which accords with the S1-direction. Thus, the directions of magnetic anisotropy in ferromagnetic layers deposited on the substrates 13 are aligned with respect to one reference directional axis r (see FIG. 9). The substrates may be of any shape, e.g. circular disk shaped, rectangular or square. Multiple thin layers of ferromagnetic material may be deposited on the substrates by subsequently passing the substrates 13 through respective sputter and alignment stations 50, possibly depositing intermediate non-ferromagnetic layers, e.g. by sputter-stations 51.

Please note that in the apparatus according to FIG. 16 the targets of the sputter and alignment stations 50 are of a ferromagnetic material. Nevertheless, it is also possible to provide one or the other or all sputter and alignment stations 50 with non-ferromagnetic targets and exploit the inventively applied further magnetic fields merely for improving the magnetron effect. Then these stations 50 become rather improved sputtering stations than sputtering and alignment stations.

Further, in the embodiment of FIG. 16 the magnetrons 48 could be mounted to the inner cylinder 54 and the dipole arrangement 34 to or along the outer cylinder 52. This especially if the inner cylinder 54 is hollow and allows easy handling of the magnetrons 48 e.g. for the exchange of the targets 1.

As apparent, the vacuum treatment apparatus 45 may comprise one or more than one sputter and alignments stations 50 according to the invention, one or more than one improved sputtering stations 50 according to the invention and possibly one or more than one further vacuum treatment stations 51 as of etching stations, sputtering stations, etc.

In the embodiment or variant of FIG. 16 the substrates are rotated around axis $A_C$ with the normals $N_o$ on their extended surfaces pointing in radial direction with respect to axis $A_C$.

FIGS. 16 and 17 show schematically and simplified a further vacuum treatment apparatus 55 according to the invention and performing a sputtering method or substrate manufacturing method according to the invention. This variant or embodiment generically accords with the variant or embodiment of FIG. 14 with the rotational axis $A_r$ perpendicular to the target planes.

In this embodiment or variant substrates 13 are deposited on a disk or ring-shaped substrate carrousel 67 for multiple substrates 13. The disk or ring-shaped substrate carrousel 67 is rotatable around an axis $A_D$, controllably driven by a drive 68. The vacuum enclosure 60 defines a disk or ring-shaped reaction space I wherein the disk or ring-shaped substrate carousel 67 is rotatable. Besides of a cylindric wall 69, coaxial to axis $A_D$, the vacuum enclosure 60 comprises a top wall 70 with an inner surface $70_i$, and a bottom wall 72 with an inner surface $72_i$, extending perpendicularly to the axis $A_D$. Substrates 13 are arranged along the periphery of the substrate holder carousel 67 with their normals $N_o$ on their extended surfaces parallel to the axis $A_D$.

In the sputtering and alignment station 50, the magnetic dipole arrangement 34 is mounted outside the reaction space I, along or outside the bottom wall 72, whereas the magnetron 48 is mounted to the top wall 70. The sputter and alignment station 50 according the invention is mounted in alignment with the moving path of the substrates 13 as rotated around axis $A_D$.

In analogy to the variant and embodiment according to FIG. 16, also in the variant and embodiment of FIG. 17 multiple sputter and alignment stations 50 may be provided so as to deposit on the substrates 13 multiple thin ferromagnetic layers possibly with interposed layers of non-ferromagnetic material as sputter-deposited by sputter-stations 51.

If the stations 50 are not exploited for aligning the magnetic field along a directional axis in a respectively deposited layer of ferromagnetic material but are exploited merely as improved magnetron sputtering stations, then the substrates 13 may be drivingly rotated—$\omega_{13}$—around their central axes $A_{13}$, which also prevails for such case at the embodiment of FIG. 16.

With an eye on exploiting the sputtering station as a alignment station one should consider: If a substrate 13 is moved pass such a station 50 for aligning the magnetic anisotropy in the ferro-magnetic layer as deposited along an axis r (see FIG. 9) then the substrate should pass the station 50 maintaining a constant directional orientation with respect to the direction of the resulting magnetic field $B_r$ of the station 50. This is exemplified in FIG. 18.

The stationary station 50 generates, seen in direction S1, a homogeneous resulting magnetic field $B_r$ in one direction, according to a linear locus $L_{50}$. A substrate 13 is moved—$M_{13}$—relative to the station 50 whereby the complete extended surface of the substrate passes through the area of field $B_r$. $V_{13}$ indicates the orientation of the substrate 13 in the x/y plane. At least during a time span, in which the substrate 13 becomes exposed to the magnetic field $B_r$ of the station 50, the angle γ between the orientation $V_{13}$ of the substrate 13 and the locus $L_{50}$ should be kept constant.

In the variant and embodiment according to FIG. 16 this is realized.

In the variant and embodiment according to FIG. 17 the movement of the substrates 13 passing in a rotational movement around axis $A_D$ the one or more than one stations 50 acting as sputter and alignment stations is additionally to be controlled to fulfil the condition as described in context with FIG. 18.

FIG. 19 shows schematically and simplified one possibility of fulfilling the condition as exemplified in FIG. 18 at a variant and embodiment of FIG. 17.

The station 50 acting as a sputter and alignment station is rigidly mounted with respect to the vacuum recipient 60, as schematically shown. With respect to a selected angle reference R, the angle $β_o$ of the orientation direction of the resulting magnetic field $B_r$ is known.

The substrate 13, shown as rectangular, but which may be of any desired shape, is held on a substrate holder 66 which is rotatable around the axis $A_{13}$ on the substrate holder carousel 67. A reference orientation direction on the substrate is established and thus known. Such reference orientation may be marked on the substrate 13 as by a flat, but needs not to be physically recognizable on the substrate 13. By means of an angle sensor 74 coupled to the rotation axis $A_{13}$ of the substrate holder 66 the prevailing angle γ' between the prevailing orientation direction $V_{13}$ of the substrate and the direction $V_{50}$ of the magnetic field $B_r$ is measured. By means of a negative feedback control loop the angle γ' is controlled to be constant on a selected angle value $γ_o$. The prevailing measured angle γ' is compared at a difference forming unit 76 with the desired angle $γ_o$ and the resulting difference Δ, the control difference, is led via an appropriate controller (not shown) to the control input of a rotation drive 80 for the substrate holder 66 around axis $A_{13}$, as the adjusting member in the negative feedback control loop. Thereby the substrate 13 passes the station 50 at a constant, selectable angle $γ_o$ with respect to the direction of the magnetic field $B_r$.

What is claimed is:
1. A method of magnetron sputter-deposition or of manufacturing a substrate coated with a magnetron-sputter-deposited layer, comprising:
providing in a vacuum enclosure a target of ferromagnetic material having a sputter surface and extending along a target plane;
providing a substrate having a surface to be sputter coated on a substrate holder;
providing a reaction space between said sputter surface and said surface to be sputter coated;
generating in said reaction space a magnetron magnetic field, the magnetic field lines thereof, arcing between a first outer pole surface of said sputter surface and a first inner pole surface, said first outer pole surface forming a closed loop on said sputter surface around said first inner pole surface, seen in a direction towards said sputter surface;
generating in said reaction space and between at least one second outer pole surface and at least one second inner pole surface located within said loop a further magnetic field;

generating a resultant magnetic field in said reaction space, by superposition of said magnetron magnetic field, and said further magnetic field;

controlling by said resultant magnetic field the direction of magnetic anisotropy in a layer sputter deposited on said substrate, along at least a predominant part of said surface of said substrate to be sputter coated, to become unidirectional, by providing said at least one second outer pole surface outside the periphery of a substrate on said substrate holder, seen in direction towards said sputter surface and by selecting the magnetic polarity of said first outer pole surface and the magnetic polarity of said at least one second outer pole surface to be equal and selecting the magnetic polarity of said first inner pole surface and the magnetic polarity of said at least one second inner pole surface to be equal.

2. The method of claim 1 comprising providing said closed loop with a single maximum loop diameter, said at least one second outer pole surface comprising a bar shaped arrangement of at least one second outer pole surface on one side of said single maximum loop diameter and a further bar shaped arrangement of at least one second outer pole surface on the other side of said single maximum loop diameter, seen in a direction towards said sputter surface.

3. The method of one of claim 1 or 2 comprising generating said resultant magnetic field along a predominant surface area of said sputter surface.

4. The method of one of claim 1 or 2 comprising tailoring said magnetron magnetic field and said further magnetic field in said reaction space so, that, seen in the direction towards said sputter surface, field lines of said further magnetic field are parallel to field lines of said magnetron magnetic field along at least a part of said closed loop.

5. The method of one of claim 1 or 2 thereby providing said at least one second outer pole surface outside said first outer pole surface, seen in a direction towards said sputter surface.

6. The method of one of claim 1 or 2 thereby providing said at least one second inner pole surface as a part of said sputter surface.

7. The method of one of claim 1 or 2 thereby providing said at least one second inner pole surface distant from and opposite said sputter surface.

8. The method of claim 7 thereby providing said at least one second inner pole surface opposite said sputter surface with respect to said substrate.

9. The method of one of claim 1 or 2 thereby providing said at least one second outer pole surface, seen parallel to said target plane, in at least one of the following positions:
opposite to said sputter surface with respect to said substrate;
aligned with said substrate;
between said target plane and said substrate and closer to said substrate than to said target plane;
between said target plane and said substrate and more distant from said substrate than from said target plane;
between said target plane and said substrate and equidistant from said substrate and from said target plane;
aligned with said target plane;
opposite said substrate with respect to said target plane.

10. The method of one of claim 1 or 2 comprising generating said resultant magnetic field to be homogeneous along a predominant surface area of said surface of said substrate to be sputter coated.

11. The method of claim 2 comprising, seen in a direction towards said sputter surface, providing a first leg of said first outer pole surface extending on one side of said single maximum loop diameter along a first linear locus and providing a second leg of said first outer pole surface extending on the other side of said single maximum loop diameter along a second linear locus, said one bar shaped arrangement extending along said first leg and said further bar shaped arrangement extending along said second leg.

12. The method of claim 11 thereby providing said first and second legs extending linearly.

13. The method of claim 12 comprising providing said first and second legs parallel to each other.

14. The method of claim 2 thereby providing said bar shaped arrangement and said further bar shaped arrangement extending along linear loci seen in a direction towards said sputter surface.

15. The method of claim 14 thereby selecting said one and said further bar shaped arrangements to extend linearly.

16. The method of claim 2 wherein said one and said further bar shaped arrangements extend with respective constant spacing aside said legs.

17. The method of one of claim 1 or 2 comprising selecting a part of a vacuum-exposed surface of said vacuum enclosure as said at least one second outer pole surface or selecting a vacuum exposed surface of a part mounted to said vacuum enclosure.

18. The method of one of claim 1 or 2 comprising relatively moving said substrate and said target so that said substrate passes across said target.

19. The method of claim 18 comprising providing more than one of said substrates and performing said method according to one of claim 1 or 2 subsequently on said more than one of said substrates.

20. The method of claim 18 comprising performing said method according to at least one of claim 1 or 2 subsequently more than once upon a substrate.

21. The method of claim 18 comprising establishing said magnetron magnetic field and said further magnetic field so, that, seen towards said sputter surface, field lines of said resultant magnetic field extend parallel to a directional axis, over a predominant part of said sputter surface and
moving said substrate relative to said target at a constant angle of substrate orientation with respect said directional axis.

22. The method of one of claim 18 comprising rotating said substrate relative to said target around a rotation axis which is remote from said substrate.

23. The method of claim 22 said rotation axis intersecting normals on said surfaces to be sputter-coated of said substrates at angles between 0° and 45° ' both limits included, preferably at an angle of 0° and thus being parallel to said normals.

24. The method of claim 22 said rotation axis intersecting normals on said surfaces to be sputter-coated of said substrates at angles between 45° and 90° ' both limits included, preferably at an angle of 90° and thus being parallel to said normals.

25. The method of one of claim 1 or 2 comprising generating, nearer to said surface to be sputter coated, the strength of said further magnetic field to be larger than the strength of said magnetron magnetic field, and more remote from said surface to be sputter coated, the strength of said further magnetic field to be weaker than the strength of said magnetron magnetic field.

26. The method of at least one of claim 1 or 2, said first outer pole surface and said at least one second outer pole surface as well as said first inner pole surface and said at least one second inner pole surface being at least relative to each other stationary.

* * * * *